United States Patent
Suhara

(10) Patent No.: US 8,168,947 B2
(45) Date of Patent: May 1, 2012

(54) ELECTROSTATIC LATENT IMAGE EVALUATION DEVICE, ELECTROSTATIC LATENT IMAGE EVALUATION METHOD, ELECTROPHOTOGRAPHIC PHOTORECEPTOR, AND IMAGE FORMING DEVICE

(75) Inventor: Hiroyuki Suhara, Yokohama (JP)

(73) Assignee: Ricoh Company, Ltd., Tokyo (JP)

(*) Notice: Subject to any disclaimer, the term of this patent is extended or adjusted under 35 U.S.C. 154(b) by 254 days.

(21) Appl. No.: 12/481,209

(22) Filed: Jun. 9, 2009

(65) Prior Publication Data

US 2009/0302218 A1    Dec. 10, 2009

(30) Foreign Application Priority Data

Jun. 10, 2008    (JP) ................. 2008-152206

(51) Int. Cl.
*H01J 37/26* (2006.01)
(52) U.S. Cl. ............ 250/306; 250/307; 250/492.1; 250/492.3; 324/457; 324/458; 430/296
(58) Field of Classification Search .......... 250/306, 250/307, 310, 311, 492.1, 492.3; 324/457, 324/458; 430/296, 297, 298
See application file for complete search history.

(56) References Cited

U.S. PATENT DOCUMENTS

| | | | |
|---|---|---|---|
| 6,054,241 A * | 4/2000 | Yamamoto et al. | 430/122.4 |
| 7,239,148 B2 | 7/2007 | Suhara | |
| 7,400,839 B2 | 7/2008 | Suhara | |
| 7,403,316 B2 | 7/2008 | Amada | |
| 2005/0045821 A1* | 3/2005 | Noji et al. | 250/311 |
| 2008/0088316 A1* | 4/2008 | Suhara | 324/457 |
| 2008/0170282 A1 | 7/2008 | Amada et al. | |
| 2008/0253792 A1 | 10/2008 | Suhara | |
| 2009/0051982 A1 | 2/2009 | Suhara | |

FOREIGN PATENT DOCUMENTS

| | | |
|---|---|---|
| JP | 3-49143 | 3/1991 |
| JP | 3-200100 | 9/1991 |
| JP | 2003-295696 | 10/2003 |
| JP | 2003-305881 | 10/2003 |
| JP | 2004-251800 | 9/2004 |
| JP | 2005-166542 | 6/2005 |
| JP | 2008-233376 | 10/2008 |

* cited by examiner

*Primary Examiner* — David A Vanore
*Assistant Examiner* — Nicole Ippolito
(74) *Attorney, Agent, or Firm* — Dickstein Shapiro LLP

(57) ABSTRACT

An electrostatic latent image evaluation device includes an optical scanner configured to irradiate laser light of a wavelength of 400 nm-800 nm on a photoreceptor sample, and form an electrostatic latent image, an electron gun configured to irradiate a charged particle beam to the photoreceptor sample having the electrostatic latent image, and surface electric charge distribution or surface electric potential distribution, a detector configured to detect an electron emitted from the photoreceptor sample by the irradiation of the charged particle beam, and an electrostatic latent image evaluation section configured to calculate sizes of a plurality of electrostatic latent images formed by the laser light each having different exposure energy density according to a detection signal detected by the detector, and evaluate the electrostatic latent image according to a change in the calculated sizes.

9 Claims, 17 Drawing Sheets

RELATIONSHIP BETWEEN ACCELERATION VOLTAGE
AND CHARGED POTENTIAL

SPATIAL FREQUENCY = 1 / CIRCLE-EQUIVALENT DIAMETER

SPATIAL FREQUENCY = 1 / CIRCLE-EQUIVALENT DIAMETER

10
ELECTROSTATIC LATENT IMAGE EVALUATION DEVICE, ELECTROSTATIC LATENT IMAGE EVALUATION METHOD, ELECTROPHOTOGRAPHIC PHOTORECEPTOR, AND IMAGE FORMING DEVICE

PRIORITY CLAIM

The present application is based on and claims priority from Japanese Patent Application No. 2008-152206, filed on Jun. 10, 2008, the disclosure of which is hereby incorporated by reference in its entirety.

BACKGROUND OF THE INVENTION

1. Field of the Invention

The present invention relates to an electrostatic latent image evaluation device, an electrostatic latent image evaluation method, an electrophotographic photoreceptor and an image forming device, in particular, to an electrostatic latent image evaluation device and an electrostatic latent image evaluation method, which measure an electric charge distribution or an electric potential distribution on a surface of a dielectric body with high accuracy in micron order.

2. Description of the Related Art

It is well known that electric charge on a surface of a dielectric body is spatially scattered in the dielectric body. For this reason, on the surface of the dielectric body, the electric charge is distributed in the surface direction along the surface. The electric charge includes not only electrons but also ions. In addition, a dielectric body to which a voltage is applied by a conductive section provided in the surface of the dielectric body and in which an electric potential distribution is generated on or near the surface of the dielectric body is used as the dielectric body.

There is a conventional method of measuring the surface potential of a dielectric body. In such a method, a sensor head is moved closer to the dielectric body having an electric potential distribution, an electrostatic attractive force and an induction current generated at that time are measured, and the measured value is converted into an electric potential distribution. This method, in principle, has a low distance resolution which is about several millimeters, and can not obtain resolution of 1 μm order.

A method of measuring an electric potential by using an electron beam with a distance resolution of 1 micron order is known as a method of evaluating an LSI chip. This evaluation method can be used for an LSI in which the input and output electric potential is limited to a low electric potential of about +5V, but this evaluation method can not correspond to an object in which electric potential on a dielectric surface of an electrophotographic photoreceptor reaches several hundred volts to several thousand volts.

On the other hand, for example, an invention described in JP H03-049143A is known as a method of visualizing an electrostatic latent image (obtaining an image) by an electron beam. In this method, a sample is partially scanned by an electron beam in advance, a back bias value which can obtain an appropriate electric potential contrast is detected by the number of obtained secondary electron signals, the power source is controlled so as to apply this back bias to the sample, the sample is scanned again by an electron beam, and image signals showing an electrostatic latent image are output by the obtained secondary electron signals.

In the invention described in JP H03-049143A, the sample is limited to an LSI chip or a sample which can memorize and hold an electrostatic latent image. For this reason, this invention can not correspond to a general electrophotographic photoreceptor generating dark decay of an electrostatic latent image, which is a target of the present invention, because of the following reasons. More particularly, since a general dielectric body semi-permanently holds electric charge, when obtaining an image of an electrostatic latent image after forming electric charge distribution (electrostatic latent image), the obtained image is not temporally changed. However, in the electrophotographic photoreceptor, since a resistance value is not infinity, the electric charge can not be maintained for a long period of time. For this reason, the dark decay of the electrostatic latent image occurs, and the surface potential is decreased with time. The electrophotographic photoreceptor can generally maintain electric charge for about 10 to 60 seconds even in a dark room. Therefore, after charging and exposing an electrophotographic photoreceptor, the electrostatic latent image disappears in a preparation step of obtaining an image of an electrophotographic photoreceptor by means of an electron microscope (SEM). Due to this feature, in the electrophotographic photoreceptor, it is necessary to obtain an image within 3 seconds at the most after forming the electrostatic latent image.

An x-ray microscope is also described in JP H03-200100A. In the x-ray microscope, an x-ray source is disposed to face one surface of an electrophotographic photoreceptor which photographs an x-ray transmission image of a sample, a scanning electron beam emitter is disposed to face the other surface of the electrophotographic photoreceptor, a secondary electron detector which detects a secondary electron emitted from a photoconductive layer of the electrophotographic photoreceptor is disposed, and a controller which converts the output of the secondary electron detector into an image is disposed.

However, the invention described in JP H03-200100A is completely different from the electrostatic latent image evaluation device and the electrostatic latent image evaluation method of the present invention in a wavelength of a beam. In the invention described in JP H03-200100A, it is impossible to form an electrostatic latent image having an arbitrary line pattern, a desired beam diameter and a desired beam profile, and an object of the present invention can not be achieved.

Consequently, the present inventors invented a device or a method of obtaining an electrostatic latent image even in a photoreceptor having dark decay, and filed patent applications. The inventions described in JP2003-295696A, JP2004-251800A, JP2008-233376A are examples.

In the meanwhile, in an image forming device such as a digital PPC (Plain Paper Copier) and a laser printer, the quality in each process such as charging, exposing, developing, transferring and fusing significantly affects the quality of a final output image. For this reason, in order to obtain a high quality image, it is necessary to improve the quality in each process. It is extremely important to evaluate the quality of an electrostatic latent image after exposing in order to obtain a high quality image. However, it is difficult to evaluate the ability of forming an electrostatic latent image because a mechanism to convert exposure energy into an electrostatic latent image is unknown. Therefore, the most appropriate value is not set for a specification of each section, and the specification of each section becomes an excessive specification in order to obtain a predetermined image quality, resulting in the increase in the costs.

The invention according to each of the above patent applications by the present inventors relates to a system capable of measuring an electrostatic latent image in a μm scale by reproducing in a vacuum device an electrostatic latent image formed on a photoreceptor for use in an electrophotographic process. By inventing and developing such a system, an environment capable of evaluating the ability of forming an electrostatic latent image, which was impossible in the conventional art, can be established.

SUMMARY OF THE INVENTION

The present invention is an improvement on the invention according to each of the above-described applications, and provides an electrostatic latent image evaluation device and an electrostatic latent image evaluation method, which was difficult to provide in the conventional art, and can evaluate the ability of forming an electrostatic latent image generated in an electrophotographic process by using a device measuring electric charge distribution or electric potential distribution on the surface of the photoreceptor made of a dielectric body, an electrophotographic photoreceptor evaluated by this evaluation device or evaluation method, and an image forming device using the electrophotographic photoreceptor.

One aspect of the present invention relates to an electrostatic latent image evaluation device including an optical scanner configured to irradiate laser light of a wavelength of 400 nm-800 nm on a photoreceptor sample, and form an electrostatic latent image, an electron gun configured to irradiate a charged particle beam on the photoreceptor sample having the electrostatic latent image, and surface electric charge distribution or surface electric potential distribution, a detector configured to detect an electron emitted from the photoreceptor sample by the irradiation of the charged particle beam, and an electrostatic latent image evaluation section configured to calculate sizes of a plurality of electrostatic latent images formed by the laser light each having different exposure energy density according to a detection signal detected by the detector, and evaluate the electrostatic latent image according to a change in the calculated sizes.

Preferably, the electrostatic latent image evaluation section is configured to calculate an area of the electrostatic latent image.

Preferably, the electrostatic latent image evaluation section is configured to calculate a circle-equivalent diameter of the electrostatic latent image according to the area of the electrostatic latent image.

Preferably, the electrostatic latent image evaluation section is configured to calculate a spatial frequency from the circle-equivalent diameter, and calculate as an evaluation value of the electrostatic latent image, every spatial frequency, a ratio of the area of the electrostatic latent image formed by the laser light having a standard exposure energy density and the area of the electrostatic latent image formed by the laser light in which the exposure energy density is changed from a standard value.

Preferably, if the standard exposure energy density is P1, the energy densities which are changed when calculating the ratio of the areas of the electrostatic latent images are P2, P3, P2, P3 satisfy the following condition, $P2 = (1-\alpha) \times P1$ $P3 = (1+\alpha) \times P1$ $0.03 <= \alpha <= 0.3$.

Preferably, the exposure energy density is varied by changing the power of the laser of a light source.

Preferably, the above electrostatic latent image evaluation device further includes a voltage applying section configured to change an electric potential of a surface of the photoreceptor sample, and the detector is configured to detect a charged particle in which a speed vector turns around before entering in the photoreceptor sample by the electric potential, and the electric static latent image evaluation section is configured to evaluate the electrostatic latent image according to a ratio of electric potential depths of the plurality of electrostatic latent images formed by different electric potential.

Another aspect of the present invention relates to an electrostatic latent image evaluation method including an optical scanning step of irradiating laser light of a wavelength of 400 nm-800 nm on a photoreceptor sample, and forming an electrostatic latent image, an irradiation step of irradiating a charged particle beam to the photoreceptor sample having the electrostatic latent image, and surface electric charge distribution or surface electric potential distribution, a detection step of detecting an electron emitted from the photoreceptor sample by the irradiation of the electric charge beam, and an evaluation step of calculating sizes of a plurality of electrostatic latent images formed by the laser light each having different exposure energy density according to a detection signal detected by the detector, and evaluating the electrostatic latent image according to a change in the calculated sizes.

Preferably, an electrophotographic photoreceptor in which an electrostatic latent image is evaluated by using the above electrostatic latent image evaluation device, and an acceleration voltage of the charged electron beam emitted from the electron gun is set to an acceleration voltage higher than a secondary electron, and in the case of forming an electrostatic latent image pattern by using an irradiator, which sets the electrophotographic photoreceptor to a predetermined charged potential, and the optical scanner, which deflects a luminous flux from a light source by a light deflector at a constant angular speed and scans the surface of the electrophotographic photoreceptor by condensing the deflected luminous flux on a surface to be scanned by a scanning and focusing system as a light spot, under the same condition as the charged potential of the photoreceptor, the beam spot diameter and the exposure energy density of the optical scanner in the electrophotographic device in a vacuum, in conditions that the wavelength of the laser light is 780 nm or below and an average beam spot diameter is 65 µm or above, the circle-equivalent diameter of the electrostatic latent image formed by the laser light having the standard exposure energy density is the average beam spot diameter or more, and a ratio of the areas of the electrostatic latent images formed by the laser light having the exposure energy density of +10% relative to the standard exposure energy density and the laser light having the exposure energy density of −10% relative to the standard exposure energy density is 60% or above.

Another aspect of the present invention relates to an image forming device, which forms an image by conducting an electrophotographic process on a photoreceptor, the photoreceptor being the above electrophotographic photoreceptor.

BRIEF DESCRIPTION OF THE DRAWINGS

The accompanying drawings are included to provide further understanding of the invention, and are incorporated in and constitute a part of this specification. The drawings illustrate embodiments of the invention and, together with the specification, serve to explain the principle of the invention.

DETAILED DESCRIPTION OF THE PREFERRED EMBODIMENT

Hereinafter, embodiments of an electrostatic latent image evaluation device, an electrostatic latent image evaluation method, an electrophotographic photoreceptor and an image forming device will be described with reference to the accompanying drawings.

Figure 1:
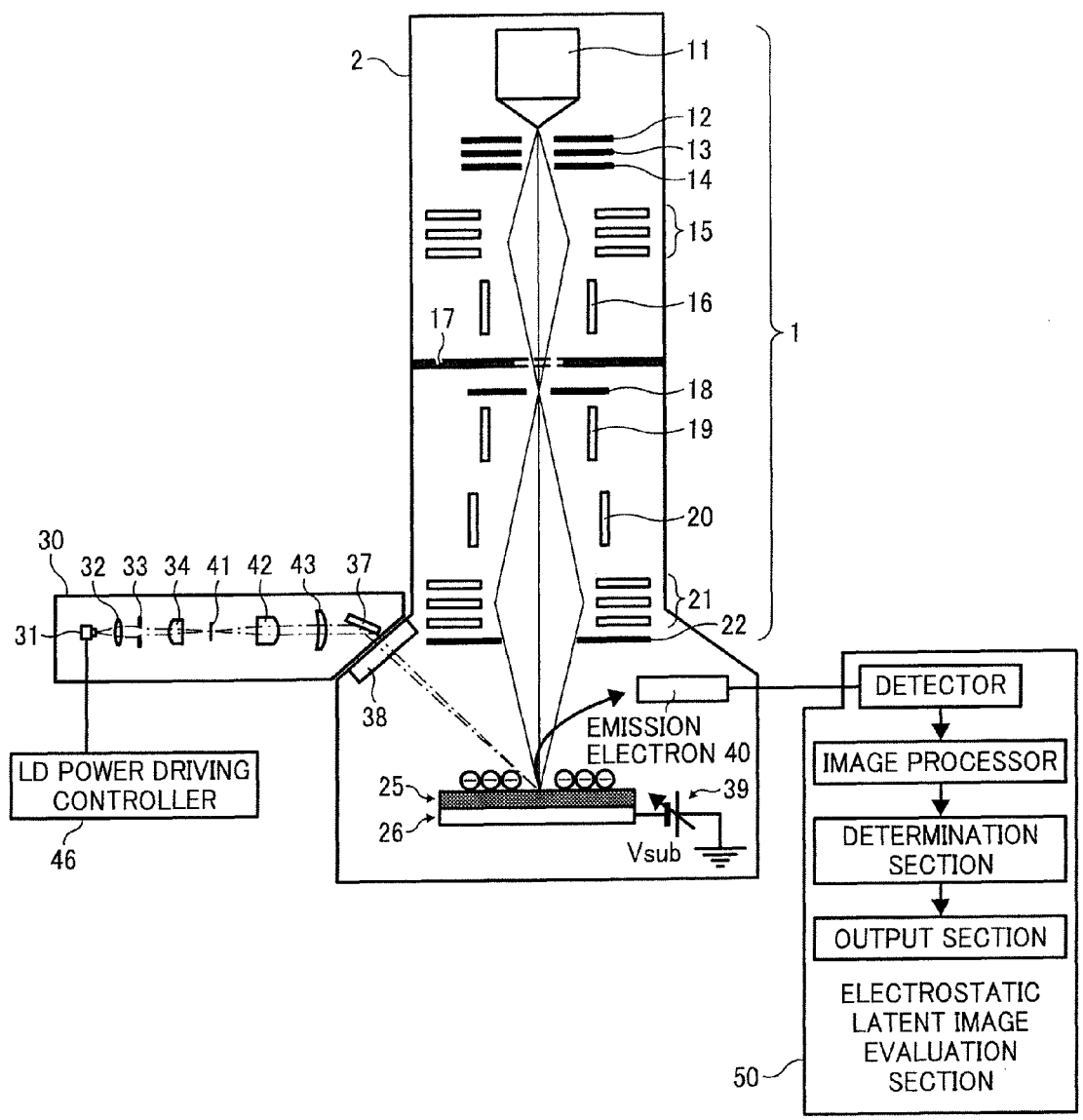
FIG. 1 is a front view illustrating an electrostatic latent image evaluation device according to one embodiment of the present invention.

Referring to FIG. 1, an electrostatic latent image evaluation device includes an irradiator 1 which irradiates a charged particle beam, an optical scanner 30 constituting an exposure optical system, a pedestal 26 onto which a sample is placed, and a detector 40 for a primary inversion charged particle, a secondary electron and the like. In this case, the charged particle beam indicates a beam, which is affected by an electric field and a magnetic field, such as an electron beam or an ion beam.

The embodiment illustrated in FIG. 1 is an embodiment which irradiates an electron beam on a photoreceptor sample 25. The irradiator 1 includes an electron gun 11 which generates a charged particle beam (hereinafter referred to as an electron beam), a suppressor electron 12 which controls an electron beam, an extraction electrode, i.e., extractor 13, an acceleration electrode 14 which controls energy of an electron beam, a condenser lens 15 which condenses an electron beam emitted from the electron gun 11, a beam blanking electron 16 which turns on and off the electron beam, a gate valve 17 and a movable aperture stop 18 as an aperture stop which controls the irradiation amount of the electron beam, a scanning lens 20 including a deflection electron scanning the electron beam after passing through the beam blanking electron 16, and an objective lens 21 which re-condenses a scanning electron beam. A stigmator 19 which corrects astigmatism of an electron beam is disposed between the movable aperture 18 and the scanning lens 20. The electron beam after passing through the objective lens 21 reaches the photoreceptor sample 25 after passing through an opening 22 which emits an electron beam. A power source for driving (not shown) is connected to each of the lenses, the electrodes and the like, and the lenses and electrons serve their own functions. The irradiator 1 is incorporated into a vacuum chamber 2, and irradiates the electron beam to the photoreceptor sample 25 disposed in the chamber 2. When using an ion beam instead of the electron beam, a liquid metal ion gun is used instead of the electron gun 11.

Figure 2A:
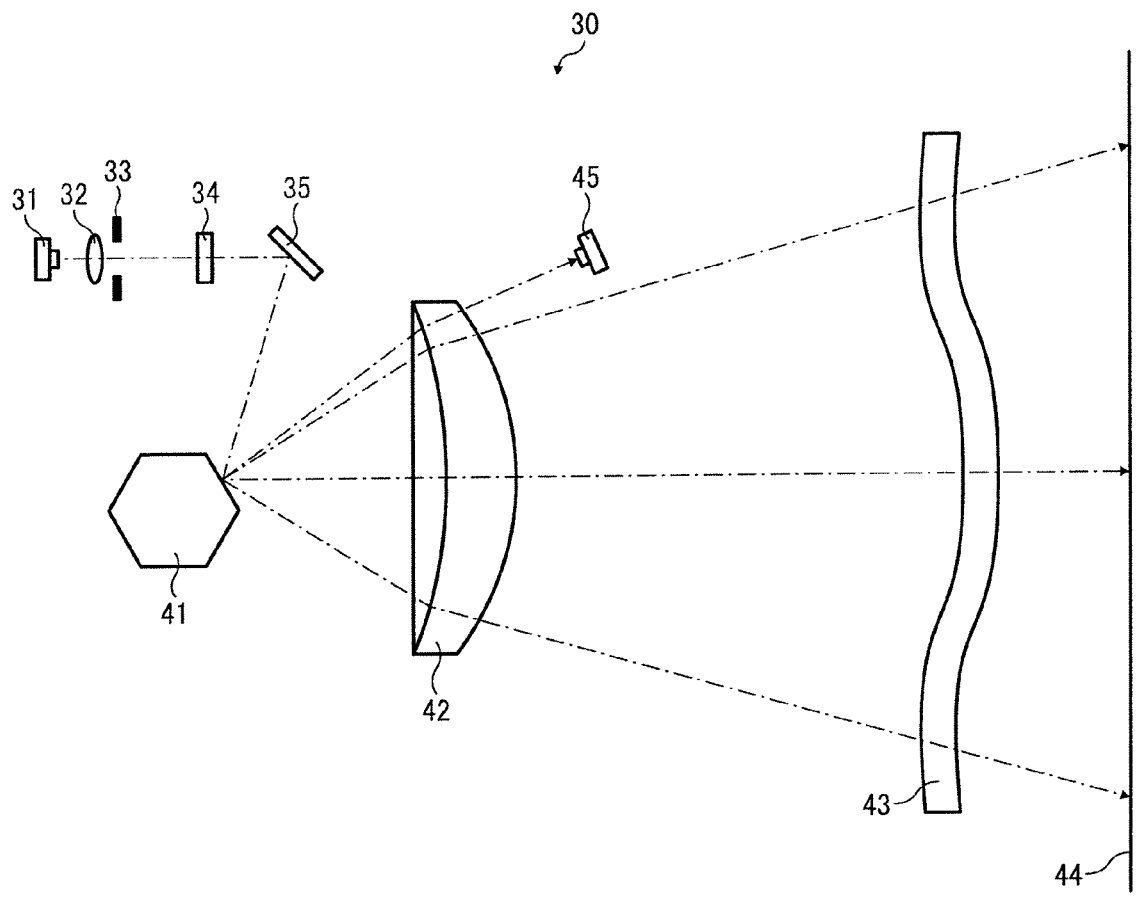
FIG. 2A is a plan view illustrating an optical scanning in FIG. 1.

Next, the optical scanner 30 constituting the exposure optical system will be described with reference to FIG. 2A.

The optical scanner 30 includes a light source 31 such as an LD (laser diode) having a wavelength capable of forming an electrostatic latent image on the photoreceptor sample 25, a collimator lens 32, an aperture stop 33, and a condenser lens 34. The optical scanner 30 forms an optical beam having a predetermined beam diameter and a beam profile on the photoreceptor sample 25 via the after-mentioned light deflector, focusing and scanning lens and the like. The optical beam can be irradiated with an appropriate exposure time and exposure energy by using an LD power driving controller 46 (refer to FIG. 1). In the example illustrated in FIG. 1, the tabular photoreceptor sample 25 is placed on the tabular pedestal 26. The optical beam is irradiated on the top face of the photoreceptor sample 25, so that an electrostatic latent image is formed on the top face of the photoreceptor sample 25.

Figure 2B:
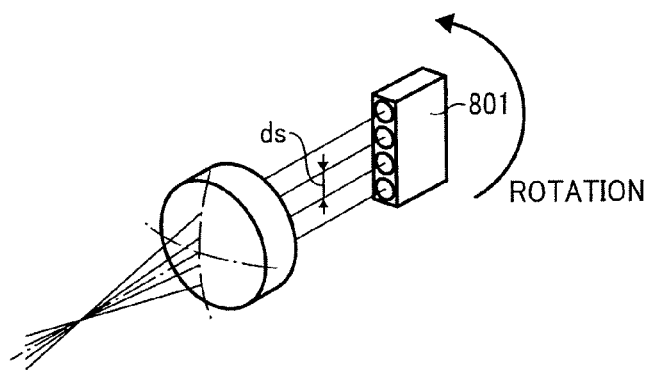
FIG. 2B is a perspective view illustrating a light source portion in FIG. 1.

The optical scanner 30 includes a polygon mirror 41 as a light deflector for the scanning of an optical beam on the photoreceptor sample 25. As illustrated in FIG. 2A, the optical beam after passing through the condenser lens 34 is reflected by a mirror 35 and is led to deflection and reflection surfaces of the polygon mirror 41. The optical beam is deflected by the polygon mirror 41 which rotates and drives at a predetermined rotation speed. A scanning lens 42 and a long lens 43 are disposed on the path of the deflected optical beam. The optical beam after passing through these lenses 42, 43 is condensed on the surface of the photoreceptor sample 25, and scans the surface of the photoreceptor sample 25. In FIG. 2A, reference number 44 denotes a surface to be scanned, and this surface 44 corresponds to the surface of the photoreceptor sample 25. An image (electrostatic latent image) is formed on the surface of the photoreceptor sample 25 by scanning the surface of the photoreceptor sample 25 with the optical beam. A scanning mechanism using a galvanic mirror, for example, can be used instead of the polygon mirror 41. As illustrated in FIG. 2B, a multi-beam light source including a surface-emitting laser (VCSEL) is used as the light source, and the scanning optical system which forms a linear pattern on the photoreceptor sample 25 by rotating the light source can be constituted. In addition, reference number 45 in FIG. 2A denotes a synchronization detector.

As illustrated in FIG. 1, it is preferable for the optical scanner 30 to be disposed outside the vacuum chamber 2 such that the electric magnetic field and the vibration by the operation of a polygon motor (not shown) rotating and driving the polygon mirror 41 influence the orbit of the electron beam emitted from the irradiator 1. By disposing the light deflector away from the orbit of the electron beam, the influence of the disturbance relative to the orbit of the electron beam can be controlled. The optical beam deflected by the optical scanner 30 enters into the vacuum chamber 2 from an optically transparent entrance window 38 disposed in the vacuum chamber 2.

Figure 5:
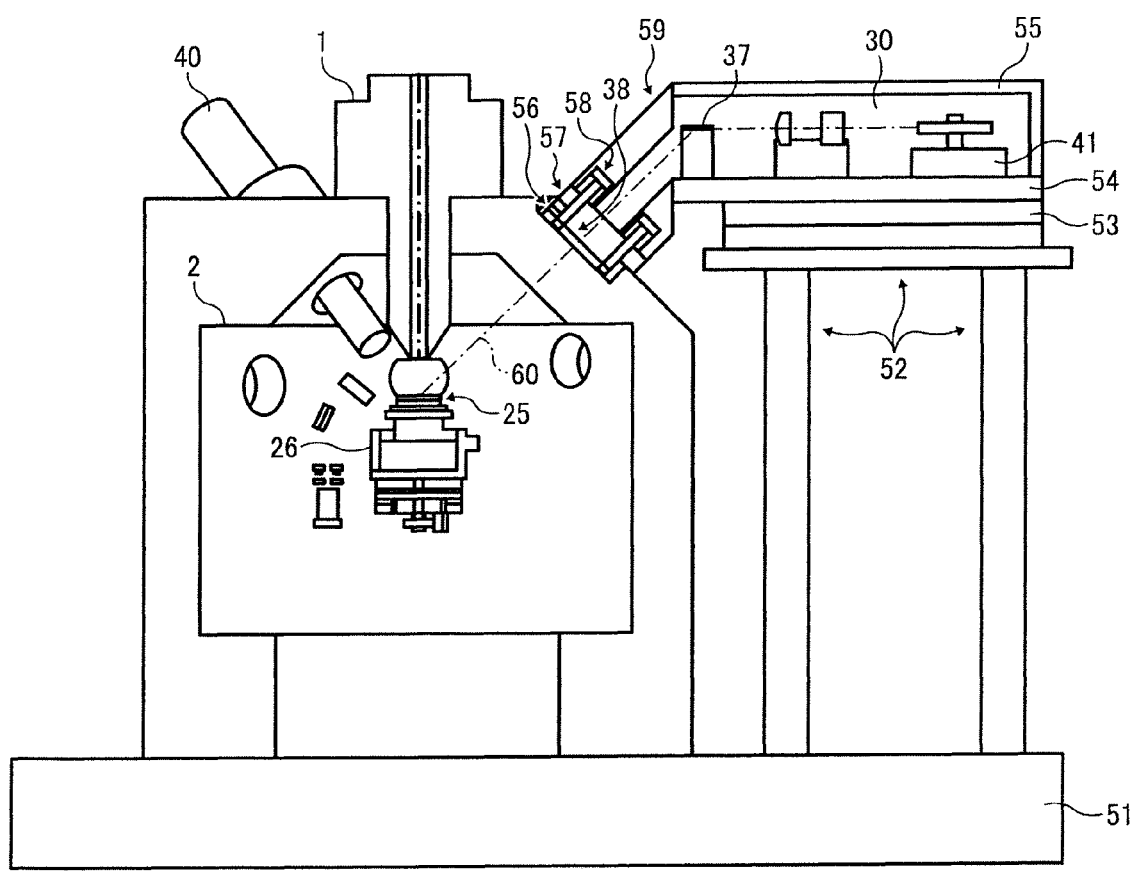
FIG. 5 is a cross-sectional view illustrating a main structure of a vacuum chamber applicable to the electrostatic latent image evaluation device according to the present invention.

Referring now to FIG. 5, the entrance window 38 from which the optical beam from the optical scanner 30 enters into the vacuum chamber 2 at an angle of 45° relative to the vertical axis of the vacuum chamber 2 is disposed in the vacuum chamber 2, and the optical scanner 30 is disposed outside the vacuum chamber 2. In FIG. 5, the optical scanner 30 includes, as described above, the light source 31, the scanning lens 42, the synchronization detector 45, and the polygon mirror 41 as the light deflector.

The vacuum chamber 2 and the optical scanner 30 are disposed on a vibration-free pedestal 51 so as to avoid the vibration from the outside. The above optical components constituting the optical scanner 30 are incorporated in a sealed space formed by an optical housing 54 and a cover 55 of the optical housing 54. The optical housing 54 is disposed on a parallel displacement base supported by a plurality of supports 52 provided on the vibration-free base 51. The out-side light (harmful light) which enters into the vacuum chamber 2 from the optical scanner 30 is shielded by entirely covering the optical scanner 30 with the optical housing 54 and the cover 55. The scanning lens 42 provided in the optical scanner 30 has an fθ feature. When the polygon mirror 41 rotates at a predetermined speed, the optical beam substantially moves at a uniform velocity and a constant beam spot diameter on the surface 44 to be scanned.

Since the optical scanner 30 into which the scanning optical system is incorporated is disposed away from the vacuum chamber 2, the vibration generated by the driving of the polygon mirror 41 is not directly transmitted to the vacuum chamber 2, and the influence of the vibration from the optical scanner 30 to the vacuum chamber 2 is small. Moreover, if a damper (not shown) is inserted between the vibration-free base and the supports 52, the effect of the vibration control can be further improved.

An internal light shielding tube 56, a light shielding member 57, a labyrinth portion 58, and an external light shielding tube 59 are incorporated into the emitting portion of the optical beam 60 toward the vacuum chamber 2 from the optical scanner 30, so that the incidence of the disturbance light into the vacuum chamber 2 is controlled.

The above-described pedestal 26 is disposed in the vacuum chamber 2. The photoreceptor sample 25 is placed on the pedestal 26. The detector 40 which detects an electron emitted from the photoreceptor sample 25 is disposed to penetrate the vacuum chamber 2. The detection signal from the detector 40 can be obtained outside the chamber 2.

As described above, by incorporating the optical scanner 30, the photoreceptor sample 25 having the uniformly charged surface is scanned by the optical beam in the generatrix direction, so that a voluntary electrostatic latent image including a line pattern can be formed on the surface of the photoreceptor sample 25. In order to form an electrostatic latent image on a predetermined position of the surface of the photoreceptor sample 25, it is preferable to use a signal detected by the synchronization detector 45 which detects the scanning beam from the polygon mirror 41. In addition, the shape of the photoreceptor sample 25 can be a plane face or a curved face.

Figure 3:
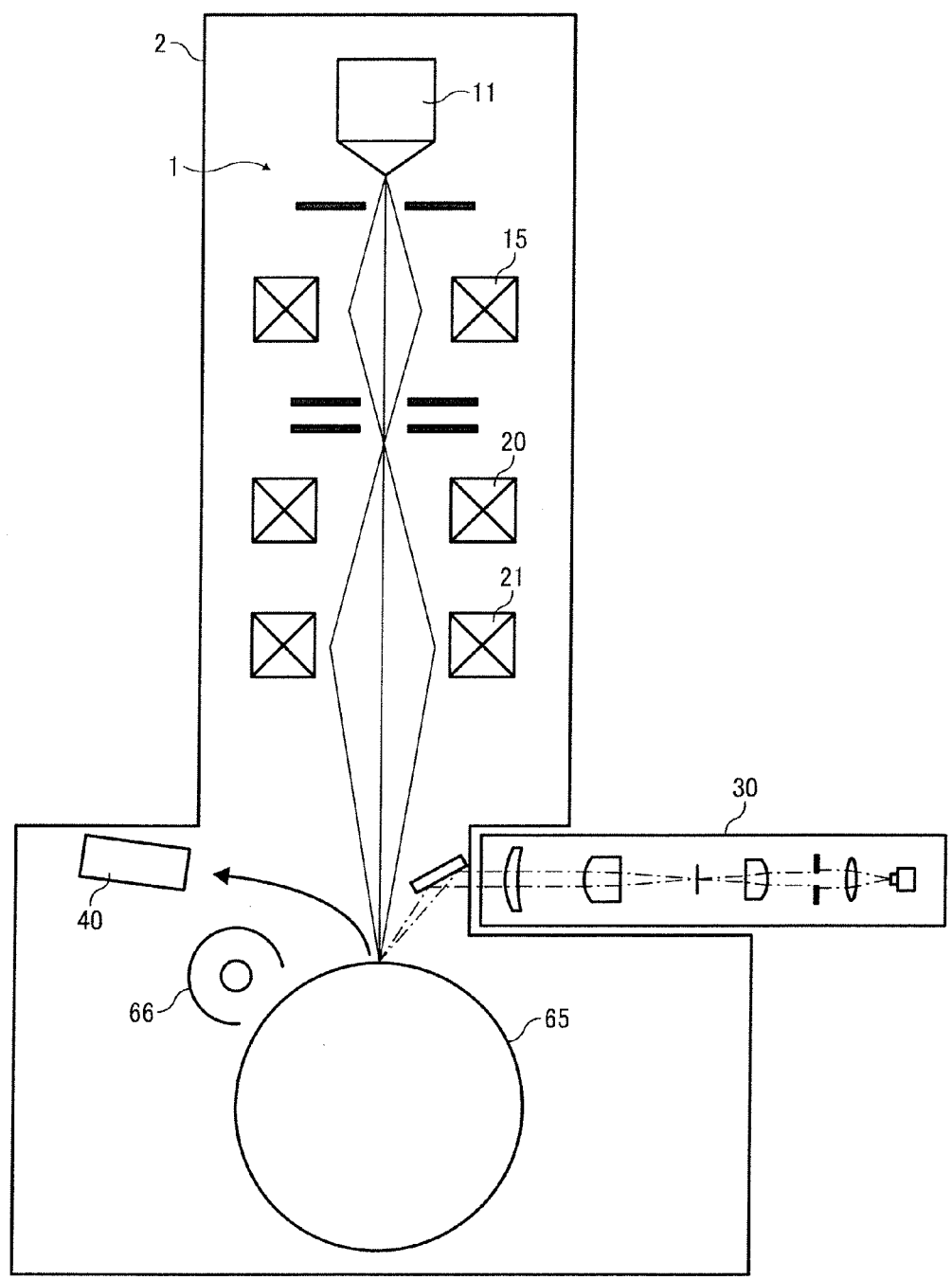
FIG. 3 is a front view illustrating an electrostatic latent image evaluation device according to another embodiment of the present invention.

FIG. 3 illustrates an embodiment in which the photoreceptor sample 25 is a cylindrical photoreceptor. The structure of this embodiment is basically the same as the structure of the embodiment illustrated in FIG. 1, so the structure described herein is simplified, and the same reference numbers are applied to the same portions. Hereinafter, the embodiment illustrated in FIG. 3 will be described while simplifying the overlapped description.

Referring to FIG. 3, reference number 1 denotes an irradiator which irradiates a charged particle beam, 2 denotes a vacuum chamber, 11 denotes an electric gun, 15 denotes a condenser lens, 20 denotes a scanning lens which is a deflection electrode, and 21 denotes an objective lens. An optical scanner 30 is disposed outside the vacuum chamber 2. The deflected optical beam enters into the vacuum chamber so as to irradiate the surface of a photoreceptor sample 65. The internal structure of the optical scanner 30 is substantially the same as the structure of the optical scanner 30 illustrated in FIG. 1. The photoreceptor sample 65 is a cylindrical shape which is the same as the cylindrical electrophotographic photoreceptor for use in an actual image forming device. The surface of the photoreceptor sample 65 is uniformly charged while rotating about the central axis line, and the deflected optical beam emitted from the optical scanner 30 irradiates the surface of the sample, so that the electrostatic latent image is formed on the surface of the photoreceptor sample 65. In FIG. 3, reference number 66 denotes a remover which removes an electric charge remaining on the surface of the sample 65, and reference number 40 denotes the above-described detector.

Figure 4A:
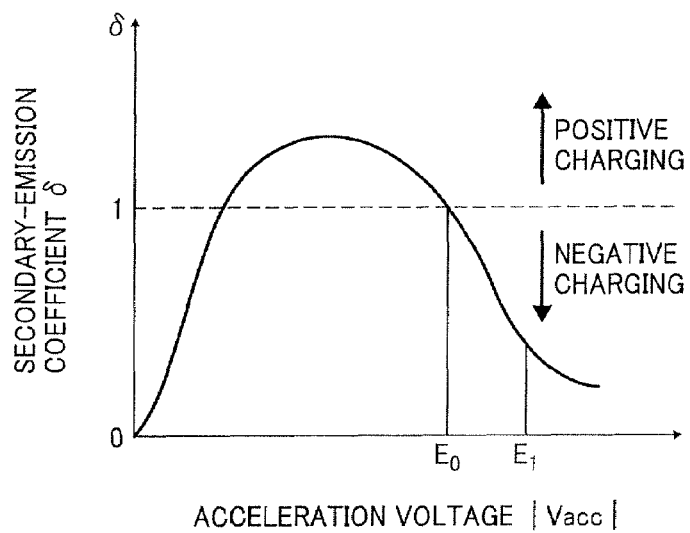
FIG. 4A is a graph illustrating a relationship between a secondary-emission coefficient and an acceleration voltage when setting a target charged potential in the electrostatic latent image evaluation device according to one embodiment of the present invention.
Figure 4B:
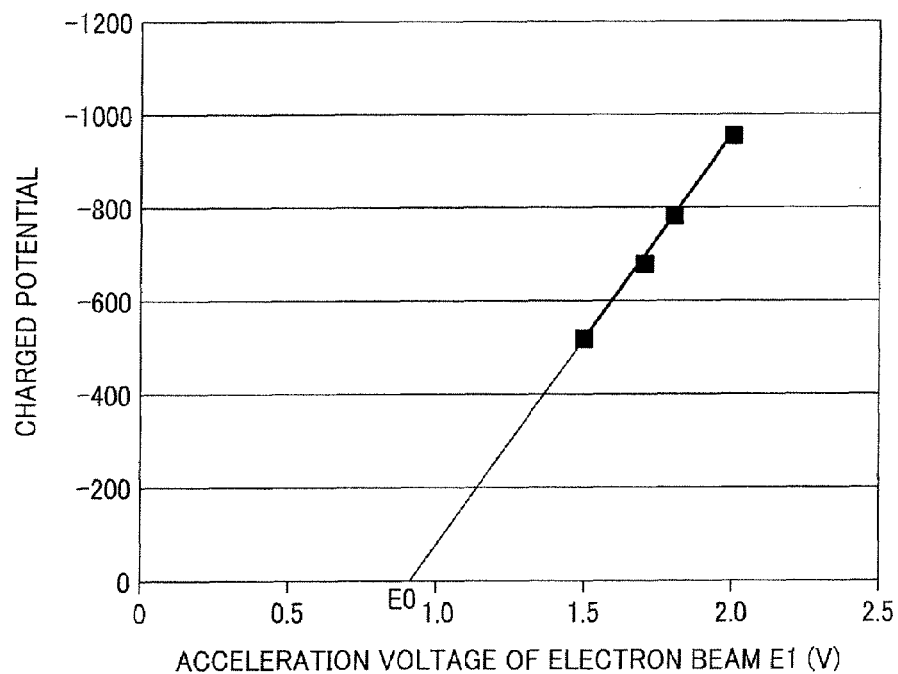
FIG. 4B is a graph illustrating a relationship between a charged potential and an acceleration voltage when setting a target charged potential in the electrostatic latent image evaluation device according to one embodiment of the present invention.

Next, the operation of the electrostatic latent image evaluation device according to the above embodiments and the evaluation method using the evaluation device will be described. At first, the electron beam is irradiated by the irradiator 1 on the photoreceptor sample 25 disposed on the pedestal 26 in the vacuum chamber 2. If an acceleration voltage |Vacc| is set to a voltage higher than an acceleration voltage in which a secondary-emission coefficient δ becomes 1, the number of incident electrons exceeds the number of emission electrons, and the electrons are accumulated in the photoreceptor sample 25, developing charging-up (refer to FIG. 4). As a result, negative electric charge is uniformly distributed on the surface of the photoreceptor sample 25, so that the surface of the photoreceptor sample 25 is charged. In order to uniformly charge the surface of the sample 25, it is necessary to deflect the electron in the direction orthogonal to the movement direction of the pedestal 26 by the deflection polarity 20 while linearly moving the pedestal 26 in one direction. The acceleration voltage and the charged potential have a relationship as illustrated in FIG. 4B. By appropriately setting the acceleration voltage and the irradiation time, the charged potential which is the same as that in the actual photoreceptor of the electrophotographic device can be formed. Since the target charged potential can be achieved in a short time by increasing the number of irradiation electrons, the irradiation is conducted by the number of irradiation electrons of nA. After that, the number of irradiation electrons is decreased to 1/100-1/1000 in order to obtain an electrostatic latent image.

Next, the optical beam is irradiated on the photoreceptor sample 25 by the optical scanner 30 so as to be exposed. The optical scanner 30 is set to form a predetermined beam diameter and beam profile. Required exposure energy is a factor which is determined by the property of the photoreceptor sample 25. The energy is generally about 2-10 mJ/m². When the sensitivity of the photoreceptor sample 25 is low, an exposure energy of several tens mJ/m² may be required. It is preferable for the required energy and the charged potential of the photoreceptor sample 25 to be set according to the process condition and the property of the photoreceptor sample 25. In this way, the electrostatic latent image is formed on the surface of the photoreceptor sample 25.

Next, the photoreceptor sample 25 is scanned by the electron beam, and the secondary electron emitted from the photoreceptor sample 25 is detected by a scintillator, i.e., the detector 40, so as to convert the secondary electron into an electric signal. Then, the signal is imaged, and a contrast image is obtained. A process for obtaining a contrast image is illustrated in the lower right section of FIG. 1. At first, the secondary electron emitted from the photoreceptor sample 25 is detected by the detector 40. This detected signal is input to an image processor so as to be imaged. This image is then input to a determination section which determines a ratio of electrostatic latent image areas, and the ratio of the latent image areas is determined, and the determination result is output. In the photoreceptor sample 25, a portion in which the electrification charge remains without being exposed has a large number of detected secondary electrons. On the other hand, a portion in which the electrification charge does not remain on the photoreceptor sample 25 has a small number of detected secondary electrons. By this difference in the number of the detected secondary electrons, the contrast image is obtained. In the determination section, a dark portion is determined as an electrostatic latent image by exposure.

If the surface of the photoreceptor sample 25 includes an electric charge distribution, the electric field distribution according to the electric charge distribution on the surface is spatially formed. The secondary electron generated by the electron beam is pushed back by this electric field, and the number of secondary electrons which reach the detector 40 is decreased. Accordingly, in the portion having an electric charge leakage, the exposed portion becomes black and the non-exposed portion becomes white, so that the contrast image according to the electric charge distribution on the surface can be obtained.

Figure 6A:
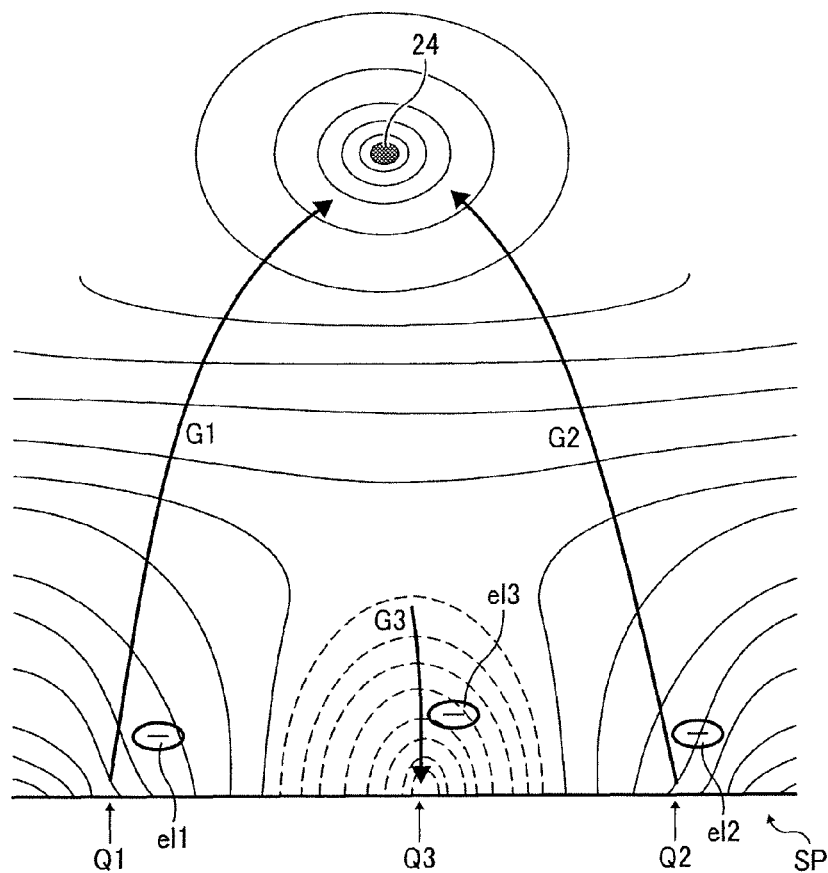
FIG. 6A is a view illustrating electric charge distribution and electric potential distribution by secondary electrons.

FIG. 6A illustrates, by using counter lines, the electric potential distribution in a space between a charged particle capturing device 24 (corresponding to the detector 40) and a sample SP. The surface of the sample SP is uniformly charged to a negative polarity except for the portion where the electric potential is attenuated by the irradiation. On the other hand, a positive electric potential is applied to the charged particle capturing device 24. Therefore, in the electric charge counter line group illustrated by the solid lines, the electric potential is increased as it gets closer to the charged particle capturing device 24 from the surface of the sample SP. The secondary electrons e11, e12 generated at the points Q1, Q2 which are uniformly charged to the negative polarity are, thus, attracted by the positive potential of the charged particle capturing device 24, move as illustrated by the arrows G1, G2, and are captured by the charged particle capturing device 24.

Figure 6B:
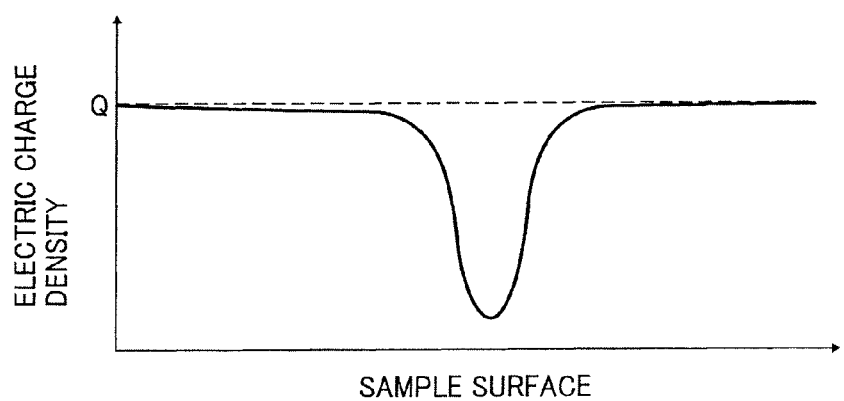
FIG. 6B is another view illustrating electric charge distribution and electric potential distribution by secondary electrons.

On the other hand, in FIG. 6A, the point Q3 is a portion where the electric potential is attenuated by the irradiation. The arrangement of the potential counter lines near the point Q3 is as illustrated by the dotted lines, and the electric potential is increased as it gets closer to the point Q3. More particularly, the electric force which pulls on the sample SP side acts on the secondary electron e13 generated near the point Q3 as illustrated by the arrow G3. Consequently, the secondary electron e13 is captured by the potential hole illustrated by the dotted counter lines, and does not move toward the charged particle capturing device 24. FIG. 6B schematically illustrates the potential hole. The portion having high intensity (the number of secondary electrons) of the secondary electron detected by the charged particle capturing device 24 corresponds to the portion in which the electrostatic latent image is not formed, i.e., the portion which is uniformly charged by the negative polarity (the points Q1, Q2 in FIG. 6A). The portion having low intensity of the secondary electron detected by the charged particle capturing device 24 corresponds to the portion in which the electrostatic latent image is formed, i.e., the portion which is irradiated (the point Q3 in FIG. 6A).

By sampling the signal output from the detector 40 of the secondary electron in the signal processor in an appropriate sampling time, the surface potential distribution: V (X,Y) can be specified every micro region corresponding to the sampling time with the sampling time T as a parameter. As described above, the two-dimensional image data is obtained from the above surface potential distribution (electric potential contrast image): V (X, Y) by the signal processor. By outputting this image, the electrostatic latent image is obtained as a visualized image. For example, if the intensity of the captured secondary electron is expressed by the intensity of the brightness, the portion where the electrostatic latent image is formed is dark and the portion where the electrostatic latent image is not formed is bright, so that the contrast image according to the surface potential distribution can be expressed (output). Regardless, the surface charge distribution can be obtained from the surface potential distribution.

The operation of the electrostatic latent image evaluation device and the electrostatic latent image evaluation method according to the present invention is based on the premise that the area of the electrostatic latent image hardly changes if the laser power is changed when forming the electrostatic latent image on the photoreceptor sample, namely, the electrostatic latent image is highly robust to the laser power, and an idealistic latent image is formed.

Figure 7:
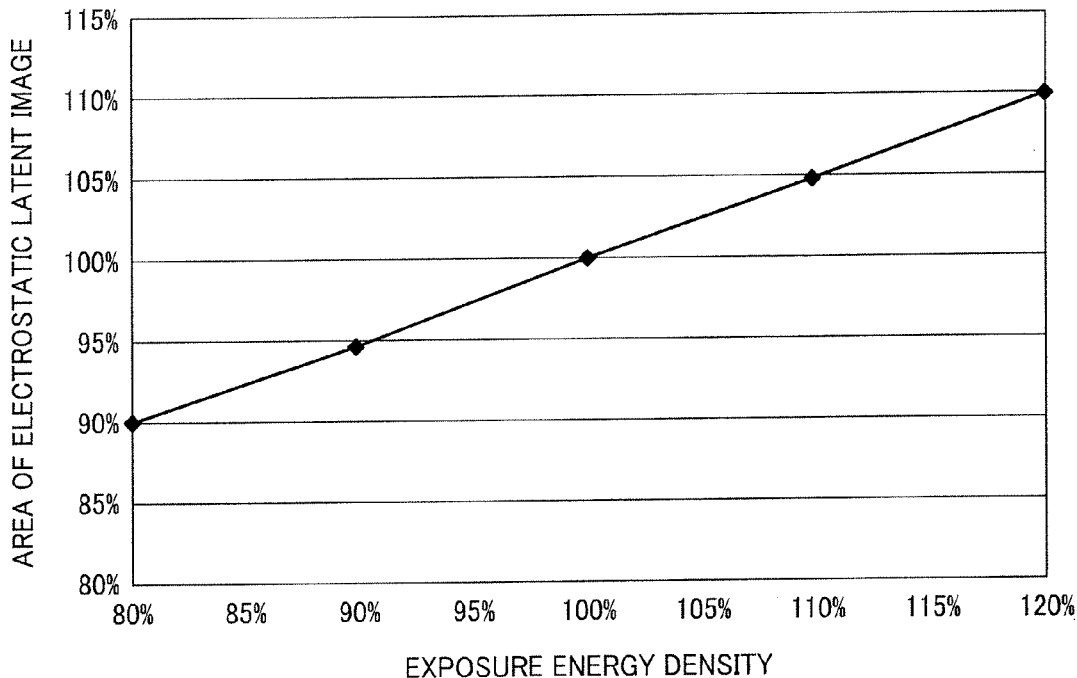
FIG. 7 is a graph illustrating a relationship between an area of an electrostatic latent image and exposure energy density of laser light when forming an electrostatic latent image on a sample of a photoreceptor.
Figure 8:
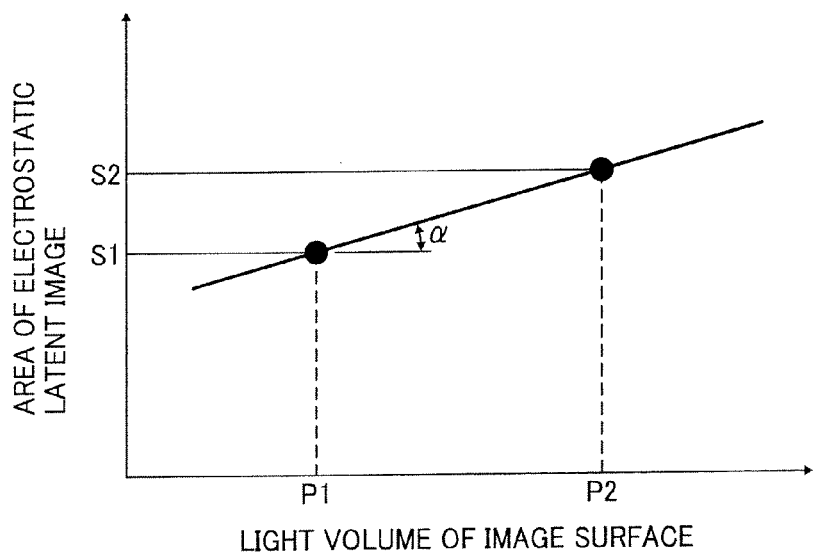
FIG. 8 is a graph illustrating a relationship between an area of an electrostatic latent image and light volume in an image face of a photoreceptor sample.

FIG. 7 illustrates a relationship between an area of an electrostatic latent image and exposure energy in a one-dot isolated pattern formed on the photoreceptor sample 25. The diameter of the electrostatic latent image and the area of the electrostatic latent image are increased with the increase in the exposure energy density, and the relationship is linearly changed. This inclination of this straight line is changed by the photoreceptor feature and the exposure condition such as the beam spot diameter and the area of the electrostatic latent image. If the inclination of this straight line is reduced, a preferable electrostatic latent image is formed. As illustrated in FIG. 8, a plurality of electrostatic latent images (at least two images) in which the exposure amounts are different to each other is formed, and the inclination of the straight light is calculated according to the areas of the formed electrostatic latent images. The ability of forming a latent image of the latent image forming system can be thereby quantitatively evaluated.

Figure 9:
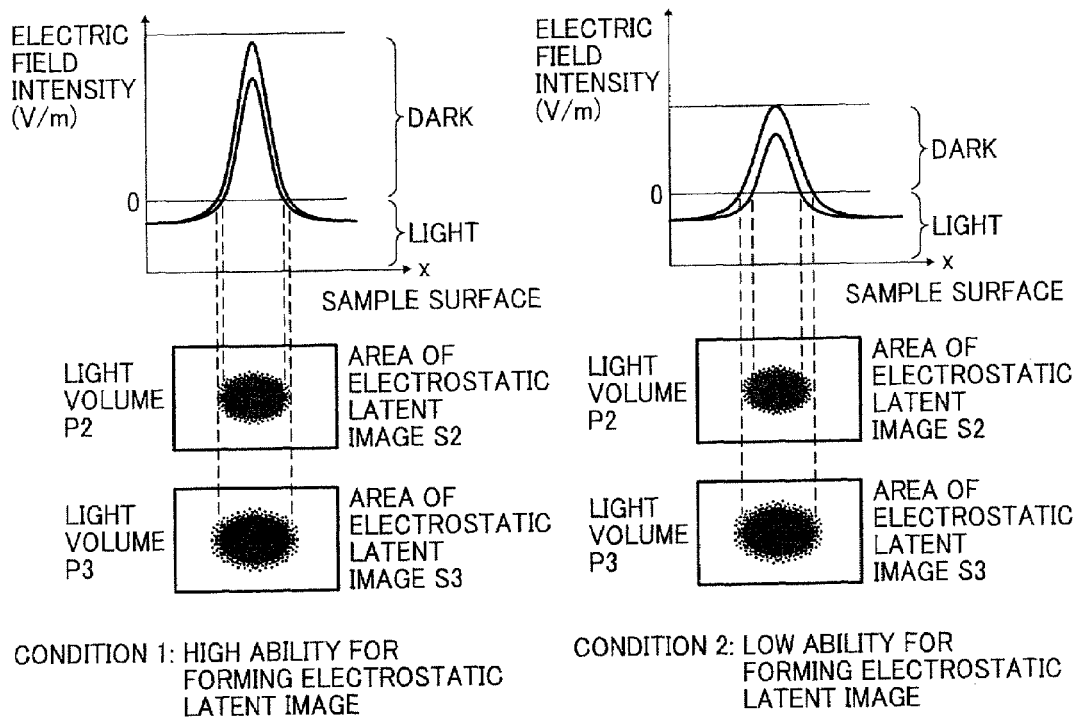
FIG. 9 is a view illustrating a relationship between an area of an electrostatic latent image and a difference in an ability of forming an electrostatic latent image on a photoreceptor sample.

FIG. 9 illustrates a relationship between an electrostatic latent image formation condition and an area of an electrostatic latent image. The left side view in FIG. 9 illustrates a high ability (condition 1) of forming an electrostatic latent image in which the electric potential is large, and illustrates small change in the areas of the electrostatic latent images according to the variation in the light volume. On the other hand, the right side view in FIG. 9 illustrates a low ability (condition 2) of forming an electrostatic latent image, i.e., deteriorated dot reproducibility in which the electric potential is small, and illustrates large change in the areas of the electrostatic latent images according to the variation in the light volume. Therefore, by comparing the sizes of a plurality of electrostatic latent images generated by the difference of the exposure energy density irradiated on the photoreceptor sample 25, the ability to form a latent image can be quantitatively evaluated.

When evaluating an electrostatic latent image, an image frequency is determined from a required writing density, and an electrostatic latent image is formed on the photoreceptor sample with the parameters such as beam spot diameter, a duty ratio of the laser, and exposure energy. At first, an acceleration voltage of an electron beam is set to an acceleration voltage higher than a secondary electron, and the electron beam is irradiated to an organic photoreceptor (photoreceptor sample) having a sensitivity to a light of 400-800 nm for use in an electrophotographic process, so that the charged potential can be set on the photoreceptor sample. In an actual electrophotographic device, corona charging, scorotron charging, and the like are used. As illustrated in FIG. 4B, the straight line relationship is established between the acceleration voltage of the electron beam and the electrification potential on the sample, so that the aimed charged potential can be set even in a vacuum, and an actual equipment environment can be reproduced.

Figure 10:
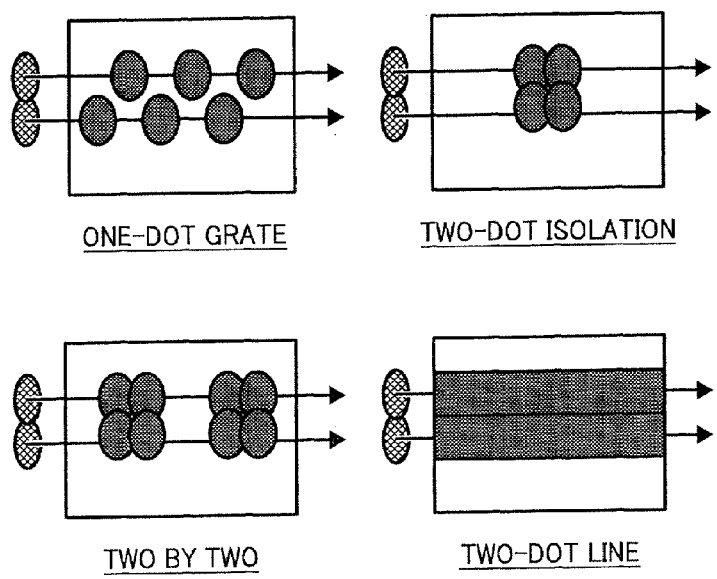
FIG. 10 is a view illustrating examples of patterns of various electrostatic latent images by a scanning optical system applicable to the present invention.

Next, the electrostatic latent image is formed by exposure. The above-described optical scanner 30 is used as an exposure optical system. It is preferable to set the exposure conditions such as an image pattern, writing density, an image frequency, a duty ratio of a laser, a beam spot diameter (for example, 30-100 μm), and exposure energy density (for example, 0.5-10 mJ/m$^2$) corresponding to the actual device of the electrophotographic device. As the image pattern, various patterns can be used such as one-dot grate, two-by-two, two-dot isolation, two-dot line as illustrated in FIG. 10, in addition to the one-dot isolated pattern.

Next, an electrostatic latent image pattern is formed under a condition of an image surface light volume=P1 as a standard light volume. Then, the electrostatic latent image pattern is detected by using the detector 40, and the detected pattern is recorded as image data. Next, the exposure energy density (image surface light volume) is changed, so that an electrostatic latent image pattern is formed under a condition of an image surface light volume=P2. Then, the formed pattern is recorded as image data. As a device for changing the exposure energy density, an attenuation plate can be used. The image surface light volume can be set to the condition of an image surface light volume=P2 by changing the power of the LD with the LD power driving controller 46. In this case, the other conditions are fixed.

Next, the area of the electrostatic latent image is calculated by using the image of the electrostatic latent image recorded as the image data. When calculating the area of the electrostatic latent image, the counter of the electrostatic latent image is extracted by the image process in the image processor illustrated in FIG. 1, and the number of pixels inside the counter is counted. Thereby, the area of the electrostatic latent image is calculated. By means of the above method, the areas of the electrostatic latent images S1, S2 under the conditions of an image surface light volume=P1 and the image surface light volume=P2 are calculated. In order to compare the sizes of the electrostatic latent images under the two conditions, (S2−S1)/(P2−P1) is calculated, and the change in the areas of the electrostatic latent images is expressed as an inclination α. The inclination α is presented by the following equation.

$$\tan(\alpha) = (S2-S1)/(P2-P1) \quad \text{(equation 1)}$$

Figure 11:
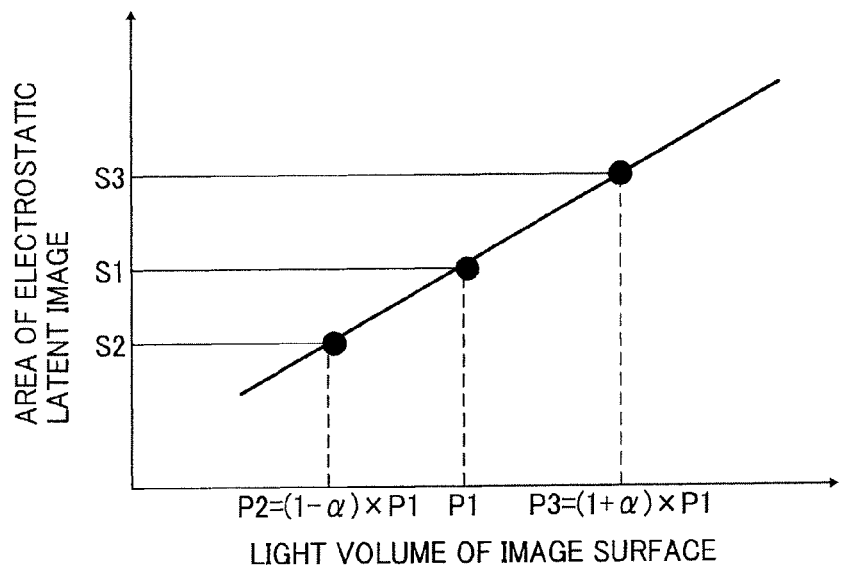
FIG. 11 is a graph illustrating a relationship between an area of an electrostatic latent image and light volume in an image face of a photoreceptor sample when calculating an electrostatic latent image area ratio in one embodiment of the present invention.

Next, another method of evaluating a change in areas of electrostatic latent images with a quantitative index will be described. At first, an electrostatic latent image pattern is formed under the condition of an image surface light volume=P1 as a standard light volume, and the area S1 of the electrostatic latent image is calculated by using the above method. Similarly, the areas S2, S3 of the electrostatic latent images are calculated under the conditions of an image surface light volume=P2, P3. In this case, the conditions P2, P3 are set as follows (refer to FIG. 11).

$$P2 = (1-\alpha) \times P1$$

$$P3 = (1+\alpha) \times P1$$

An appropriate value between 0-1 can be set for α. If the value of α is 1, a condition in which an electrostatic latent image is not formed occurs. On the other hand, the change in the areas of the electrostatic latent images is reduced as the value of α gets closer to 0, so that the SN ratio of the signal process is reduced. Therefore, 0.03<=α<=0.3 is a preferable range.

Figure 12:
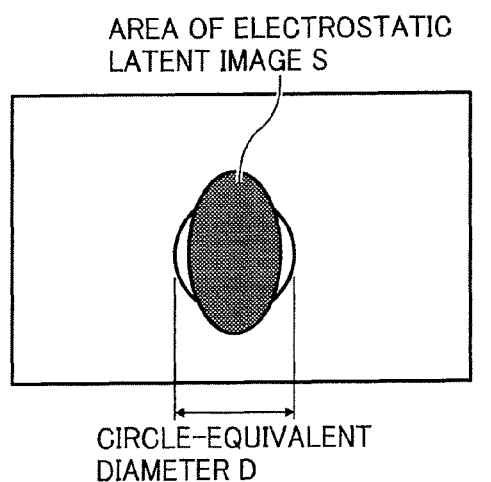
FIG. 12 is a view describing a circle-equivalent diameter for use in the evaluation of an electrostatic latent image in one embodiment of the present invention.

According to the above evaluation method, since the area of the electrostatic latent image can be calculated, the diameter of the electrostatic latent image in the main-scanning direction and the sub-scanning direction can be easily calculated. However, the electrostatic latent image includes a vertically long shape or a horizontally long shape according to the image pattern, the duty ratio of laser and the beam spot diameter in the main-scanning direction and the sub-scanning direction, so that it is more preferable to represent the area of the electrostatic latent image as a circle-equivalent diameter when evaluating the electrostatic latent image with the space frequency of the electrostatic latent image. The circle-equivalent diameter when the area of the electrostatic latent image is S: D can be represented by the following equation 2, as illustrated in FIG. 12.

$$D=2\times(S/\pi)^{0.5} \quad \text{(equation 2)}$$

By the above equation 2, the circle-equivalent diameter D1 in the standard light volume P1 can be calculated. In addition, by calculating (area S2 of electrostatic latent image under image surface light volume=P2)/(area S3 of electrostatic latent image under image surface light volume=P3), the ratio of the areas of the electrostatic latent images (electrostatic latent image area ratio) can be presented. As described above, the areas of the electrostatic latent images in the three different exposure energies (image surface brightness) are calculated, so that the ratio of the areas of electrostatic latent images in the circle-equivalent diameter D1 can be obtained by M=S2/S3. Thereby, a quantitative evaluation value for evaluating an electrostatic latent image can be obtained.

Figure 13:
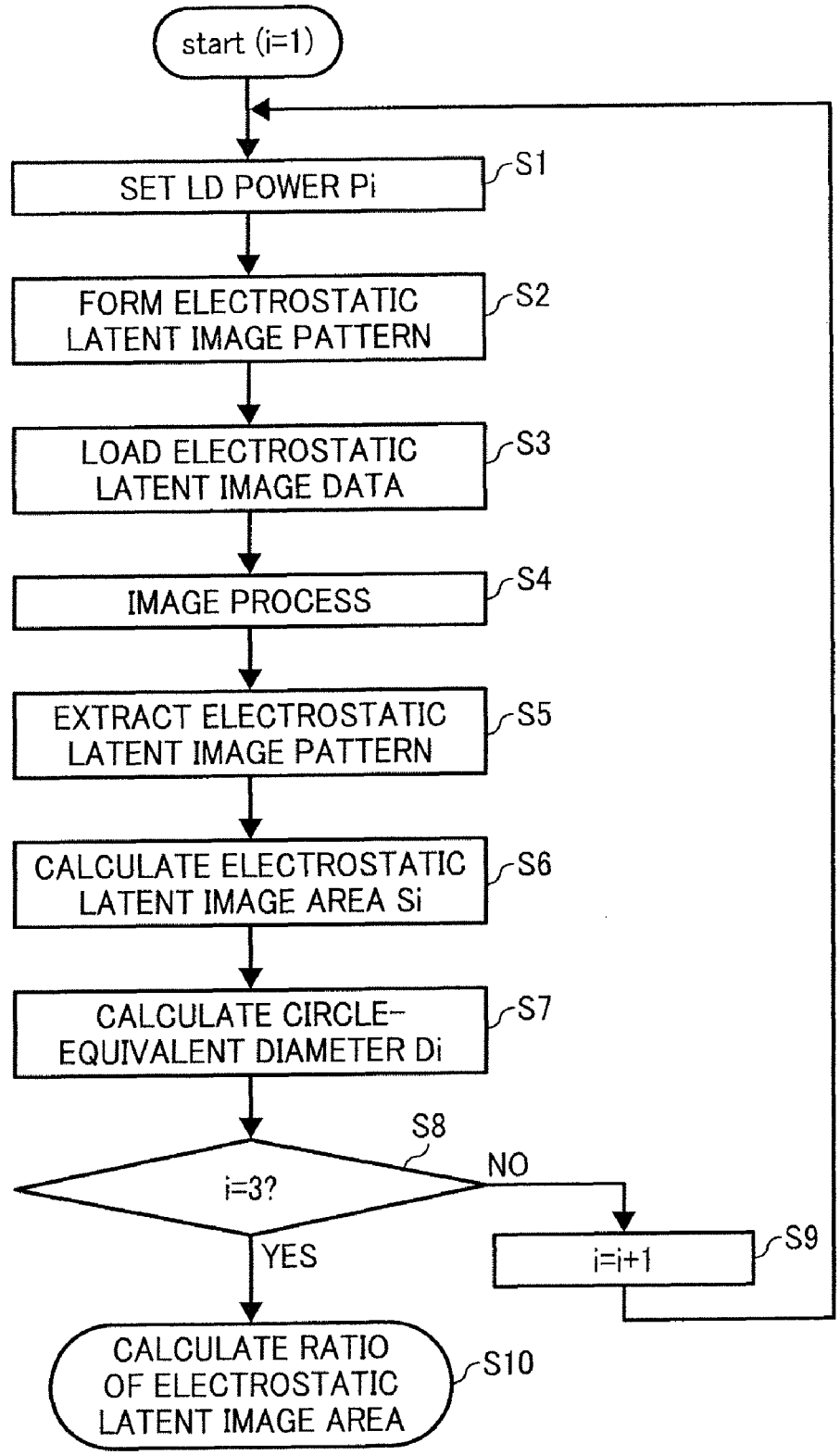
FIG. 13 is a flow chart which calculates an electrostatic latent image area ratio in one embodiment of the present invention.

FIG. 13 illustrates a flow chart calculating the electrostatic latent image area ratio. In FIG. 13, S1, S2, ... denote steps, respectively, i denotes the number of calculation of a circle-equivalent diameter, and the flow starts when i=1. In S1, LD power Pi is set. In S2, an electrostatic latent image pattern is formed by this power Pi. In S3, the electrostatic latent image data is loaded (recorded). In S4, the image process of the electrostatic latent image data is conducted. In S5, the electrostatic latent image pattern is extracted. In S6, the area of the electrostatic latent image is calculated. In S7, the circle-equivalent diameter Di is calculated. In S8, it is determined whether i=3 or not. When i does not reach 3, 1 is added to i in S9, and the same operation is repeated after returning to S1. However, a value different from the previous value is set for the LD power when repeating the operation. If three different circle-equivalent diameters are obtained by repeating the same flow three times, the flow goes to S10, which calculates the electrostatic latent image area ratio, so that the electrostatic latent image area ratio M is calculated by using the above equation.

In the calculation of the circle-equivalent diameter Di, the electrostatic latent image area ratio M can be calculated according to the average value of the circle-equivalent diameters D2, D3 obtained from the areas S2, S3 of the electrostatic latent image. By obtaining the electrostatic latent image data two times, a result, which is the same as the result when obtaining the electrostatic latent image data thee times, can be obtained.

Figure 14:
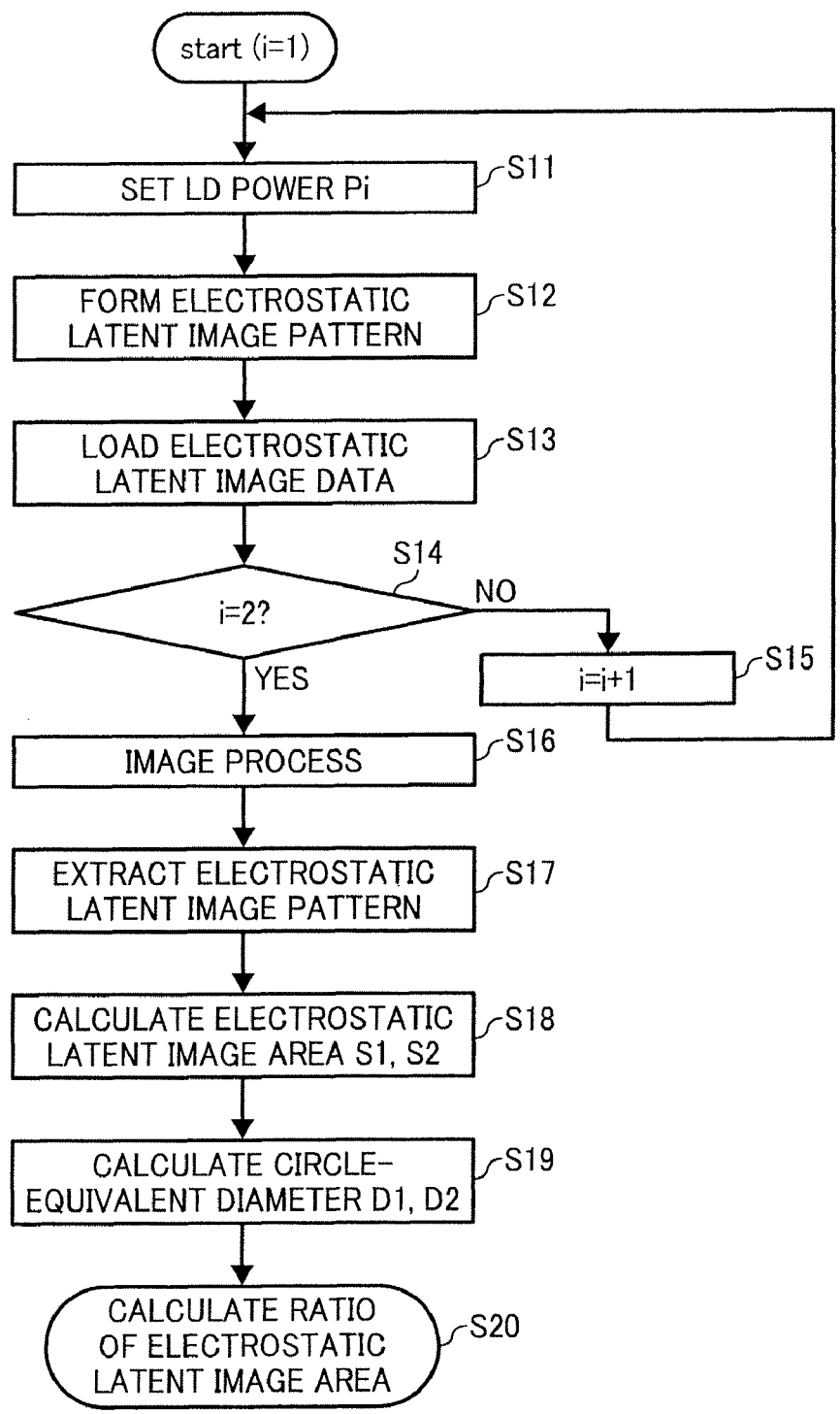
FIG. 14 is another flow chart which calculates an electrostatic latent image area ratio in one embodiment of the present invention.

The calculation of the electrostatic latent image ratio M can be conducted after obtaining electrostatic latent image data. This is illustrated in FIG. 14. The flow starts when i=1. In S11, the LD power Pi is set. In S12, the electrostatic latent image pattern is formed by this power Pi. In S13, the electrostatic latent image data is loaded (recorded). In S14, it is determined whether i=2 or not. When i does not reach 2, 1 is added to i in S15, and then a value of the power Pi different from the value of the previous power Pi is set after returning to S11, and the same operation is repeated. When two different circle-equivalent diameters Di are obtained by repeating S11-S13 two times, the flow is completed by conducting the electrostatic latent image area ratio calculation step S20 after performing the image process step S16, the electrostatic latent image pattern extraction step S17, the calculation step S18 of the electrostatic latent imager areas S1, S2, and the calculation step S19 of the equivalent circle diameters D1, D2, which are similar to those in the flow chart in FIG. 13. In addition, the value of i can be freely decided. The SN ratio in the signal process can be improved by loading the electrostatic latent image data at least two times and using the average value of the data.

The electrostatic latent image area ratio depends on the circle-equivalent diameter, i.e., the spatial frequency characteristic. If the spatial frequency is increased, the value of the electrostatic latent image area ratio gets closer to 0, resulting in the decrease in the ability of forming an electrostatic latent image. Accordingly, the circle-equivalent diameter of the electrostatic latent image is changed by changing the exposure pattern such as one-dot or two-dot, the duty ratio of the laser, and the density of the exposure energy which becomes a standard value, and the electrostatic latent image area ratio is calculated under each condition. The condition of the electrostatic latent image can be more precisely evaluated by evaluating in the spatial frequency band. In addition, the spatial frequency is an inverse number of the circle-equivalent diameter, i.e., special frequency=1/circle-equivalent diameter.

Figure 15:
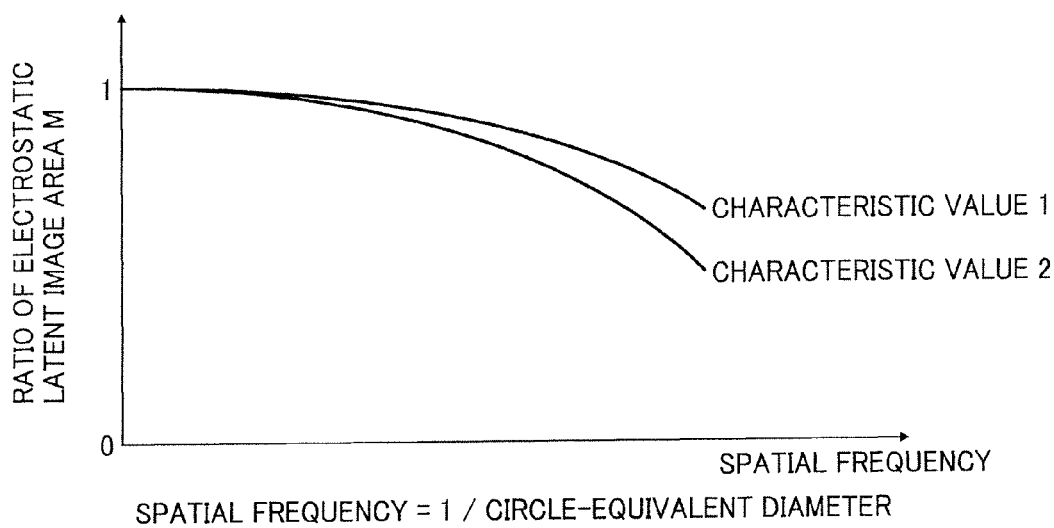
FIG. 15 is a graph illustrating a space frequency dependence of an electrostatic latent image area ratio on a photoreceptor sample.

The spatial frequency characteristic when changing a characteristic value such as a beam spot diameter and a thickness in a sample affecting the formation of the electrostatic latent image is as illustrated in FIG. 15. As illustrated in FIG. 15, if the spatial frequency is increased, the ability of forming an electrostatic latent image is decreased. The characteristic value 1 is higher than the characteristic value 2 in the ability of forming a latent image. As described above, the electrostatic latent image area ratio M is calculated by changing the circle-equivalent diameter of the electrostatic latent image, and the evaluation is conducted in the spatial frequency band, so that the condition of the electrostatic latent image can be more precisely evaluated, and the ability of forming an electrostatic latent image of the image forming system, for example, can be quantitatively evaluated.

Hereinafter, a specific embodiment will be described. An organic photoreceptor in a CTL thickness of 30 μm having sensitivity relative to light of 400 nm-800 nm is charged to −800V. When an electrostatic latent image of a one-dot isolated pattern is formed by using an LD light source of a wavelength of 655 nm under the conditions of a beam spot diameter in the main scanning direction of 60 μm, a beam spot diameter in the sub-scanning direction of 80 μm, writing density of 600 dpi, an image frequency of 40 MHz, and a duty ratio of the laser of 20-100% at an exposure energy density of 0.5-4 mJ/m² of standard light volume, the electrostatic latent image area ratio M obtained under the condition of α=0.1 relative to the standard light volume is as follows.

In the case of a circle-equivalent diameter of 128 μm, M=0.87

In the case of a circle-equivalent diameter of 65 μm, M=0.74

In the case of a circle-equivalent diameter of 44 μm, M=0.41.

Figure 16:
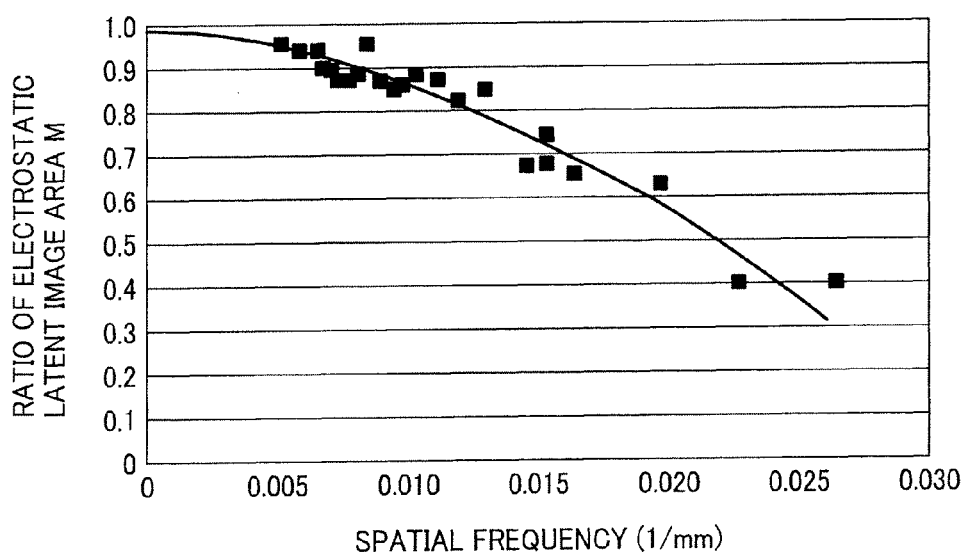
FIG. 16 is a graph illustrating a result of calculation of an electrostatic latent image area ratio on a photoreceptor sample.

Generally, if the circle-equivalent diameter is small, i.e., the spatial frequency (1/circle-equivalent diameter) is high, the electrostatic latent image area ratio M is reduced. The electrostatic latent image area ratio depends on the spatial frequency even in the same electrostatic latent image forming device. FIG. 16 illustrates the measurement result of the spatial frequency characteristic of the electrostatic latent image area ratio M. As illustrated in FIG. 16, if M becomes 0.6 or below, a stable dot can not be obtained because the change in the spatial frequency is large although the electrostatic latent image is formed. If M is 0.6 or more, a stable electrostatic latent image can be obtained. In FIG. 16, it is considered that a stable electrostatic latent image is formed to a spatial frequency of 0.02 mm or below (circle-equivalent diameter of 50 µm or more). In addition, the duty ratio and the exposure energy density are set such that the circle-equivalent diameter becomes 65 µm with different beam spot diameters. When the beam spot diameter is 60 µm in the main-scanning direction and 80 µm in the sub-scanning direction, M=0.74, and when the beam spot diameter is 45 µm in the main-scanning direction and 60 µm in the sub-scanning direction, M=0.87. Accordingly, it can be understood that a smaller diameter has a larger value of M and a high ability of forming an electrostatic latent image can be quantitatively evaluated.

In a multi-beam scanning optical system such as a VCSEL, 4 or more light sources are used, and one electrostatic latent image pattern is formed under a complex exposure condition while overlapping a plurality of multi-beams. In this case, it is difficult to understand the influence degree of each parameter. The electrostatic latent image evaluation device and the electrostatic latent image evaluation method of the present invention are especially effective under the above-described condition for forming an electrostatic latent image.

Figure 18:
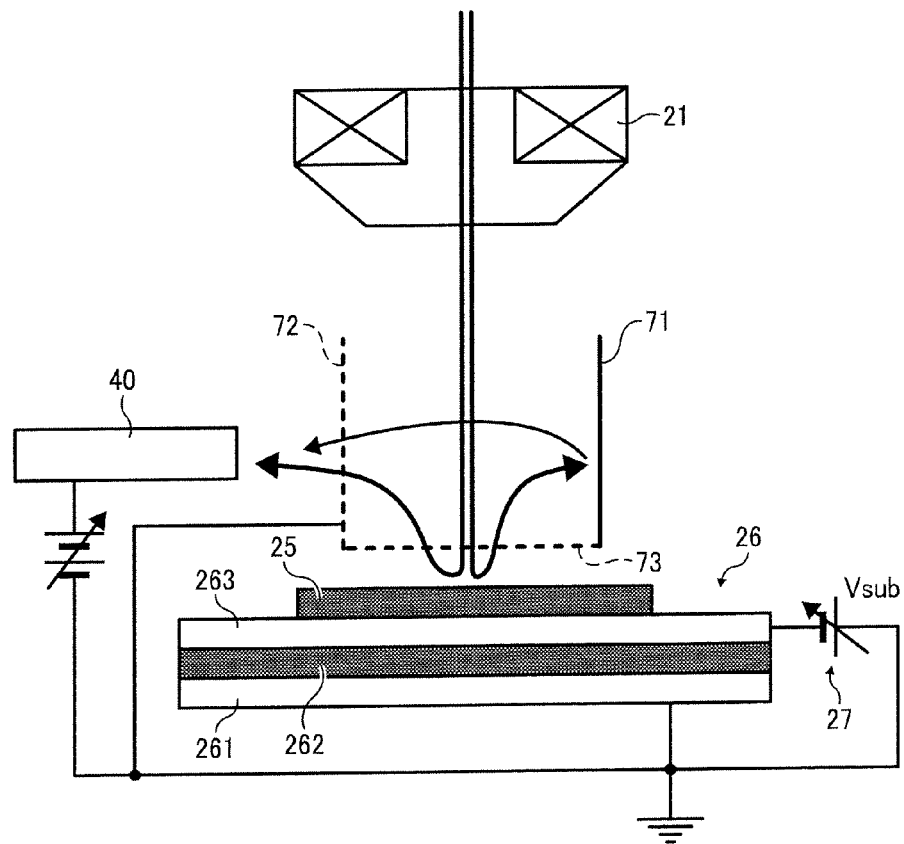
FIG. 18 is a view illustrating an electrostatic latent image evaluation device in which a grid mesh is disposed according to another embodiment of the present invention.

By measuring the profiles of the electric charge distribution and the electric potential distribution of the surface of the photoreceptor sample, the electrostatic latent image can be evaluated with high accuracy. FIG. 18 illustrates another embodiment of an electrostatic latent image evaluation device, which measures electric potential distribution of a surface of a sample. Referring to FIG. 18, a sample pedestal 26 includes a ground electrode plate 261 and a conductive plate 263 provided on the upper face of the ground electrode plate 261 via an insulation body 262. A photoreceptor sample 25 is placed on the photoconductive plate 263. A voltage ±Vsub is applied to the conductive plate 263 from a voltage source 27. The conductive plate 263 is a voltage applying section which applies the voltage ±Vsub to the lower portion of the photoreceptor sample 25. A conductive plate 71 surrounding the periphery of the electron beam path, a side grid 72 which is a conductive plate, and a grid mesh 73 which cuts across the electron beam path are disposed under the objective lens 21 and above the photoreceptor sample 25. These control the influence of the electric charge of the photoreceptor sample 25 relative to the electron beam. The conductive plate 71, the side grid 72, the grid mesh 73 are maintained in a ground potential. The electron beam (charged particle) emitted from the photoreceptor sample 25 after passing through the grid mesh 73 and the side grid 72 is detected by a detector 40. A voltage of about 10 kv is applied to the detector 40. As described above, the electrostatic latent image evaluation device illustrated in FIG. 18 is configured to have the grid mesh.

Figure 19A:
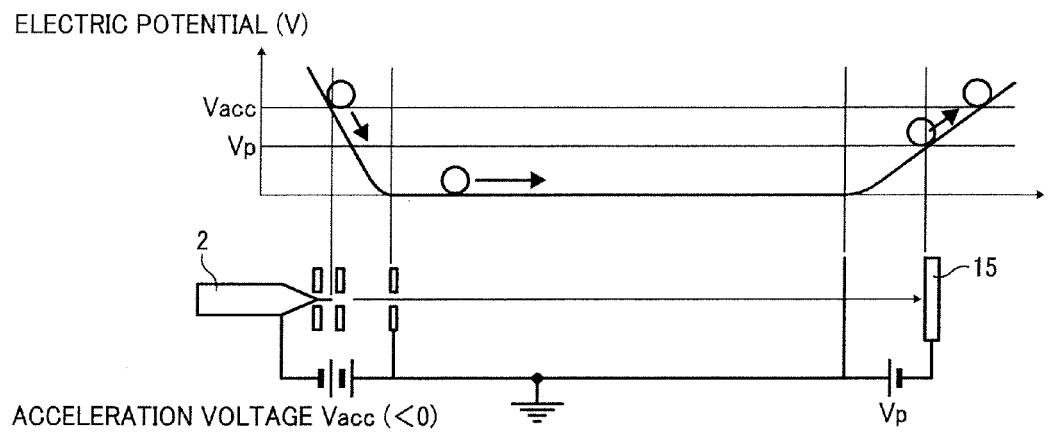
FIG. 19A is a view illustrating a relationship between an incident electron and an electric potential on a photoreceptor sample.
Figure 19B:
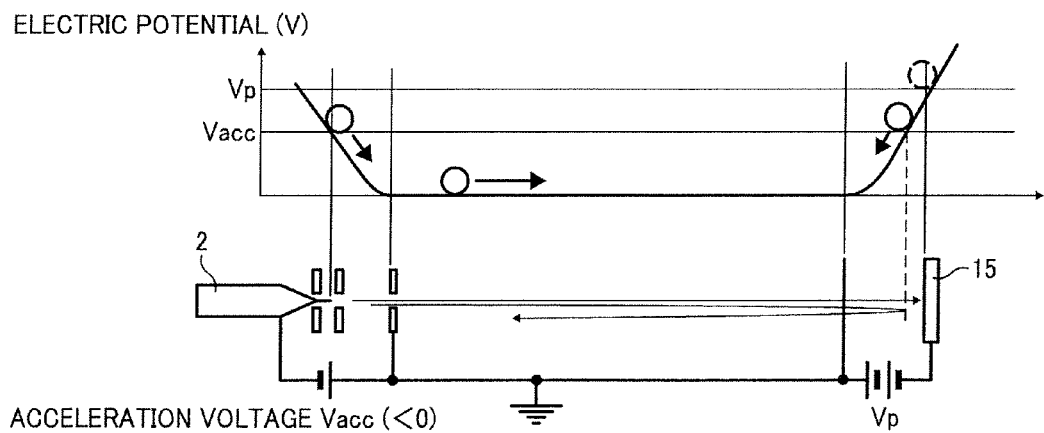
FIG. 19B is a view illustrating a relationship between an incident electron and an electric potential on a photoreceptor sample.

FIGS. 19A, 19B are views each illustrating the relationship between the electron beam and the photoreceptor sample. FIG. 19A illustrates the relationship when the acceleration voltage is larger than the surface potential. FIG. 19B illustrates the relationship when the acceleration voltage is smaller than the surface potential. An area having a condition in which a speed vector in the vertical direction of the sample of the incident electron beam (charged particle) turns around before reaching the photoreceptor sample exists near the electrostatic latent image. The detector detects the charged particle (primary inversion charged particle) which turns around before reaching the photoreceptor sample. In addition, the acceleration voltage is positive. However, the applied voltage Vacc of the acceleration voltage of the present invention is negative. It is easier to describe by negative, so that the acceleration voltage herein is negative (Vacc<0), in order to provide a physical meaning as electric potential. The acceleration potential of the electron beam is Vacc (<0), and the electric potential of the photoreceptor sample is Vp (<0).

The electron moves at a speed according to the acceleration voltage Vacc. Namely, if the electric charge amount of electron is e, and the mass of the electron is m, the initial speed of electron v0 is presented as follows.

$$(m \times v0^2)/2 = e \times |Vacc|$$

In a vacuum, by an energy conservation law, the charged particle moves at a constant speed in an area where the acceleration voltage does not work, and the electric potential is increased as it gets closer to the sample surface, and then the speed is lowered by the influence of the reaction of the clone of the electric charge from the photoreceptor sample. Accordingly, the following phenomenon occurs.

In FIG. 19A, $|Vacc| \geq |Vp|$, so that the electron speed is reduced, but the electron reaches the photoreceptor sample.

In FIG. 19B, since $|Vacc| < |Vp|$, so that the electron speed is gradually reduced by the influence of the electric potential Vp of the photoreceptor sample, and the speed becomes 0 before the electron reaches the photoreceptor sample, and then the electron travels in the opposite direction.

In a vacuum which has no air resistance, an energy conservation law is almost completely established. Therefore, when changing the energy of the electron beam, a condition in which the energy, i.e., the landing energy on the surface of the sample substantially becomes 0 is measured. Thereby, the potential of the surface of the sample can be measured. Since the primary inversion charged particle and the secondary electron which is generated when reaching the photoreceptor sample are different in the amount which reaches the detector, these can be discriminated by the border of the contrast of the image obtained by the detector. In addition, hereinafter, when the primary inversion charged particle is an electron, it is called a primary inversion electron.

The scanning electron microscope includes a reflected electron detector. In this case, a reflected electron indicates an electron which is reflected (scattered) by the surface of the sample and jumps backward to the back face. In this case, the reflected electron energy matches the energy of the incident electron. The intensity of the reflected electron is increased if the atomic number is increased. The reflected electron detected by the reflected electron detector is influenced by the difference of the composition of the sample and the asperity on the surface of the sample. On the other hand, the primary inversion electron of the present invention is an electron which has the influence of the electric potential distribution on the sample surface and turns around before reaching the surface of the sample. The primary inversion electron is completely different from the reflected electron.

Figure 20:
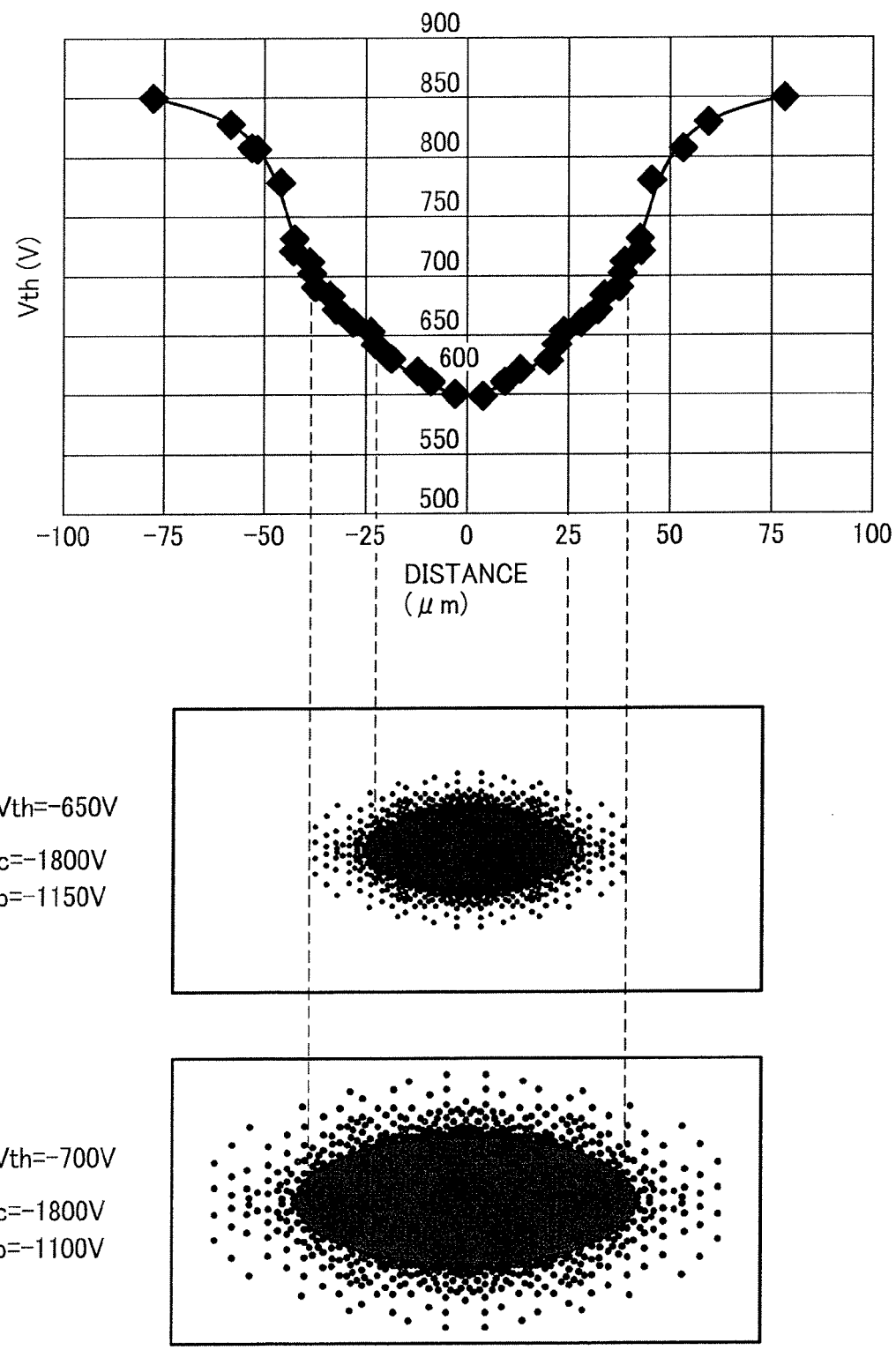
FIG. 20 is a view illustrating one example of a measurement result of an electric potential depth of an electrostatic latent image on a photoreceptor sample.
Figure 21:
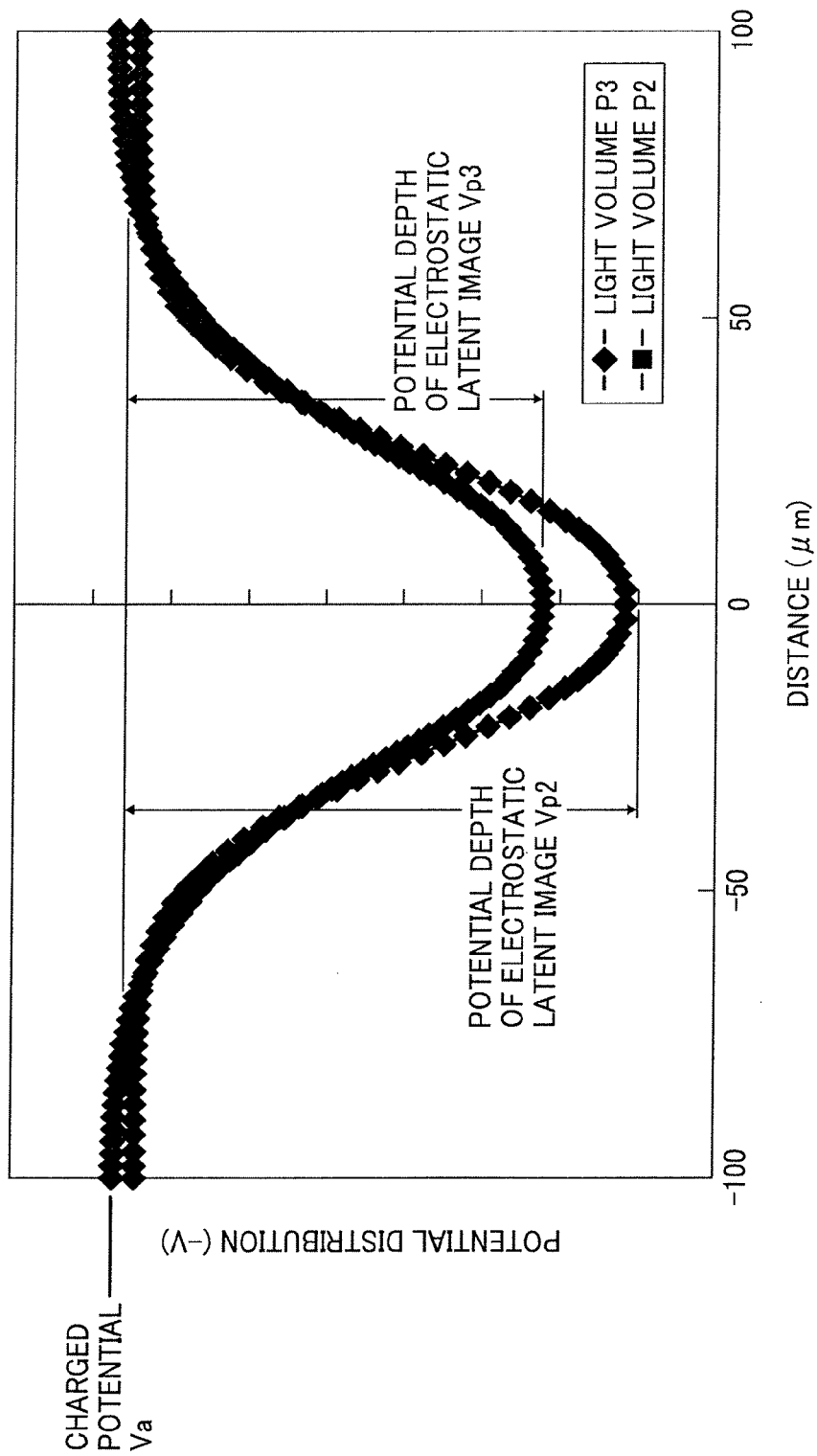
FIG. 21 is a graph illustrating a relationship between light volume and an electric potential profile of an electrostatic latent image on a photoreceptor sample.

FIG. 20 illustrates one example of a measurement result of an electric potential depth of an electrostatic latent image. In each scanning position (x, y), if the difference between the acceleration voltage Vacc and the applied voltage Vsub in the lower portion of the photoreceptor sample is Vth (=Vacc−Vsub), the electric potential distribution V(x, y) can be measured by measuring Vth (x, y) in which the landing energy substantially becomes 0. A correspondence relationship exists between Vth (x, y) and the electric potential distribution V(x, y). If V(x, y) is a smooth electric potential distribution, for example, the electric potential distribution V(x, y) approximately becomes equal to Vth (x, y).

The curved line in FIG. 20 illustrates one example of the electric potential distribution on the surface generated by the electric charge distribution on the surface of the photoreceptor sample. The applied voltage of the electric gun which two dimensionally scans is −1800V. The electric potential in the center (horizontal axis coordinate (distance)=0) is about −600V, the electric potential is increased in the negative direction from the center to the outside, and the electric potential in the peripheral area in which the radius from the center exceeds 75 μm is about −850V. The oval figure illustrated in the middle of FIG. 20 is an image of the output of the detector when setting the back face of the photoreceptor sample to Vsub=−1150V. In this case, Vth=Vacc−Vsub=−650V. The oval figure illustrated in the bottom of FIG. 20 is an image of the output of the detector obtained by the condition which is the same as the above condition except for Vsub=−1100V. In this case, Vth is −700V. As illustrated in FIG. 20, the surface potential information of the photoreceptor sample can be measured by measuring the distribution of Vth while changing the applied voltage Vacc or the applied voltage Vsub and scanning the surface of the photoreceptor sample by means of an electron.

By using the above method, the electric potential distribution of the electrostatic latent image can be measured in μm order, which was difficult in the conventional art. The electric potential depth of the electrostatic latent image is changed by changing the power of the laser. For this reason, by using the above method, the electric potential depth of the electrostatic latent image when changing the power of the laser is measured, and the ratio is calculated, so that the ability of forming an electrostatic latent image can be evaluated.

If the electric potential depth of the electrostatic latent image in the case of the light volume P2 is Vp2, and the electric potential depth of the electrostatic latent image in the case of the light volume P3 is Vp3, the ratio Mv of the electric potential depths of the electrostatic latent images can be presented as follows.

$$Mv=Vp2/Vp3$$

The spatial frequency can be set by the full width at half maximum of the electric potential profile of the electrostatic latent image, for example.

In a method of measuring an electric potential profile of an electrostatic latent image by means of a primary inversion electron, incident electron energy may change extremely, and the orbit of the electron may shift. As a result, the scanning magnification is changed, or distortion occurs. In this case, the environment of the electrostatic field or the electron orbit is previously measured, and necessary correction is conducted according to the measurement result, so that the electric potential profile can be more accurately measured.

A function necessary for the photoreceptor is an ability of forming a sufficient electrostatic latent image relative to an electrostatic latent image larger than a beam spot diameter. As for an electrophotography, dot reproducibility is necessary for improving an image, and dot reproducibility of 65 μm or more is required. A characteristic parameter of a photoreceptor effective for improving the ability of forming an electrostatic latent image of a photoreceptor includes an insulation property, a residual electric property and a thickness of a photoreceptor. The ability of forming a latent image of a photoreceptor can be evaluated by fixing the optical system parameter, and changing only the characteristic parameter of the photoreceptor.

In the conditions that the wavelength of the writing light source is 400 nm or above and 780 nm or below, and the circle-equivalent diameter of beam spot diameter is 65 μm or above, it is preferable for the ratio of the areas of the electrostatic latent images formed by the laser light having the exposure energy density of +10% relative to the standard exposure energy density and the laser light having the exposure energy density −10% relative to the standard exposure energy density to be 60% or above.

Figure 17:
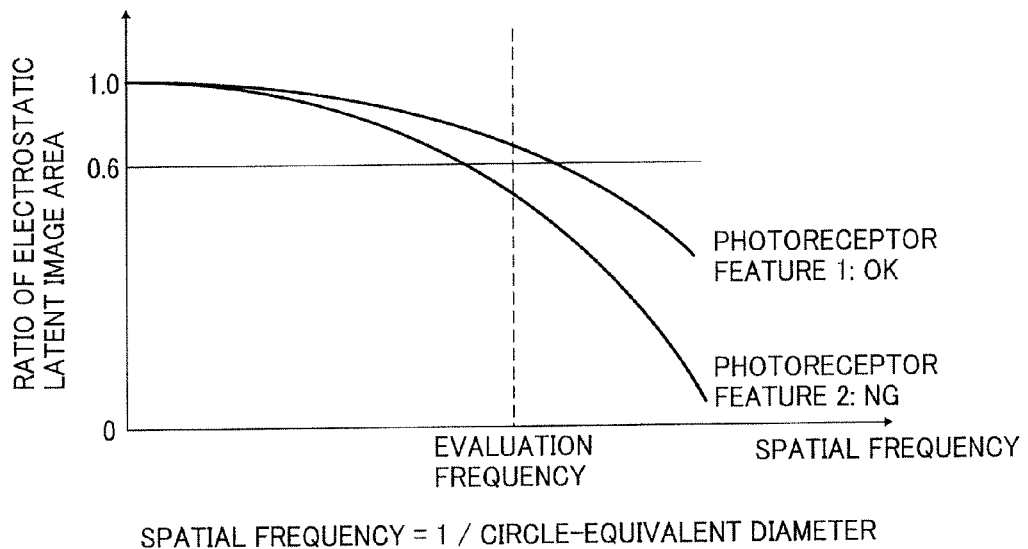
FIG. 17 is a graph illustrating a relationship between a feature of a photoreceptor and an electrostatic latent image area ratio on a photoreceptor sample.

If the result obtained by using the above evaluation method is the photoreceptor feature 2 illustrated in FIG. 17, it is evaluated that the ability of forming an electrostatic latent image is not good. In this case, the ability of forming an electrostatic latent image can be improved by reducing the thickness of the CTL film. If the thickness of the CTL film is increased, the durability of the photoreceptor is improved. Therefore, if the thickness of the CTL film is reduced, the durability of the photoreceptor is lowered. However, by using the above evaluation method, the photoreceptor having the most appropriate thickness, which includes both of a high image quality and high durability, can be designed.

Figure 22:
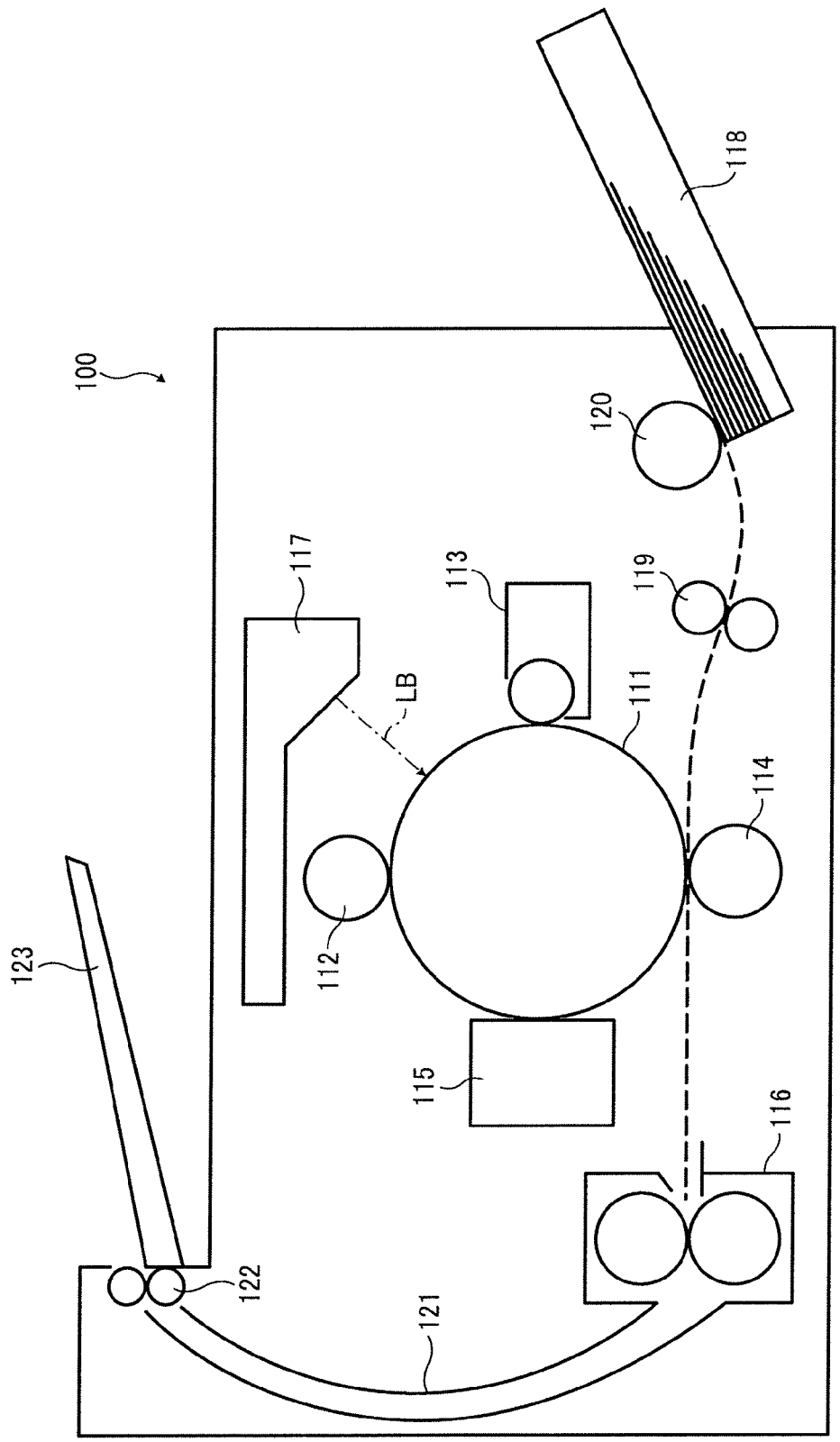
FIG. 22 is a view illustrating an image forming device according to one embodiment of the present invention.

Hereinafter, one example of an image forming device according to the present invention will be described. FIG. 22 is an example of a laser printer according to one example of the image forming device according to the present invention. A laser printer 100 includes a cylindrical photoreceptor as an image carrier 111. A charging roller 112 as a charging station, a development station 113, a transfer roller 114, and a cleaning station 115 are disposed around the image carrier 111. In this example, as the charging station, the contact type charging roller 112 which reduces the generation of ozone is used, but a corona charger using corona discharge can be used as the charging station. In addition, an optical scanning station 117 is disposed, and the exposure by the optical scanning of a laser beam LB is conducted between the charging roller 112 and the development station 113. In FIG. 22, reference number 116 denotes a fusing station, 118 denotes a paper feeding cassette, 119 denotes a resist roller pair, 120 denotes a paper feeding roller, 121 denotes a feeding path, 122 denotes a paper discharge roller pair, and 123 denotes a tray.

When forming an image, the image carrier 111 of the photoreceptor rotates at an equal speed in the clockwise direction, and the surface of the carrier 111 is uniformly charged by the charging roller 112. An electrostatic latent image is formed by the exposure of the laser beam of the scanning unit 117. The formed electrostatic latent image is a so-called negative latent image, and the image portion is exposed. This electrostatic latent image is reversely developed by the development station 113, and a toner image is formed on the image carrier 111. The cassette 118 in which transfer paper is housed is detachably attached to the body of the image forming device 100. In a state in which the cassette is attached to the body as illustrated in FIG. 22, the top sheet housed in the cassette 118 is fed by the paper feeding roller 120. The leading end portion of the fed transfer sheet is caught by the resist roller pair 119. The resist roller pair 119 sends the transfer sheet to the transfer portion according to a timing in which the toner image on the carrier 111 moves to the transfer position. The sent transfer sheet is overlapped with the toner image in the transfer portion, and the toner image is electrostatically transferred on the transfer sheet by the function of the transfer roller 114. The transfer sheet onto which the toner image is transferred is fused by the fusing station 116, and is discharged on the tray 123 by the paper discharge roller pair 122 via the paper feeding path 21. After transferring the toner image, the surface of the carrier 111 is cleaned by the cleaning station 115, and the residual toner, paper powder and the like are eliminated.

By adopting, as the photoreceptor which is the image carrier 111 of the image forming device 100, the photoreceptor which is evaluated by the above-described electrostatic latent image evaluation device or the electrostatic latent image evaluation method and satisfies the above conditions, an image having high resolution and high performance can be obtained. Also, an image forming device having high durability and high reliability can be manufactured. Such a photoreceptor is applicable especially for an image forming device in which a multi-beam scanning optical system is provided such as a VCSEL.

According to one embodiment of the present invention, the electrostatic latent image evaluation device which can quantitatively evaluate the ability of forming an electrostatic latent image formed on the electrophotographic photoreceptor can be provided.

Moreover, the electrostatic latent image evaluation section can quantitatively evaluate the electrostatic latent image by calculating the area of the electrostatic latent image.

Furthermore, the electrostatic latent image evaluation section calculates the circle-equivalent diameter of the electrostatic latent image according to the area of the electrostatic latent image. Therefore, even in the case in which the electrostatic latent image does not have a circle shape (vertically long, horizontally long and unusual form), the electrostatic latent image evaluation section can evaluate the electrostatic latent image in the spatial frequency which is the same when the electrostatic latent image is a circular shape.

In addition, the electrostatic latent image evaluation section calculates the spatial frequency from the circle-equivalent diameter, and calculates, every spatial frequency, the evaluation value of the ratio of the area of the electrostatic latent image formed by the laser light having a standard exposure energy density and the area of the electrostatic latent image formed by the laser light in which the exposure energy density is changed from the standard value, so that the ability of forming an electrostatic latent image can be evaluated.

If the standard exposure energy density is P1, and the energy densities, which are changed when calculating the ratio of the areas of the electrostatic latent image, P2, P3, P2, P3 are set to satisfy the following condition, the evaluation of the electrostatic latent image having a high SN ratio and high accuracy can be conducted.

$$P2=(1-\alpha)\times P1$$

$$P3=(1+\alpha)\times P1$$

$$0.03<=\alpha<=0.3$$

If the exposure energy density is changed by changing the laser power of the light source, the evaluation of the electrostatic latent image corresponding to various electrostatic latent image conditions can be conducted.

The electrostatic latent image evaluation device according to one embodiment of the present invention further includes the voltage applying section configured to change the electric potential of the surface of the photoreceptor sample. The detector is configured to detect the charged particle in which the speed vector turns around before entering in the photoreceptor sample by the electric potential, and the electrostatic latent image evaluation section is configured to evaluate the electrostatic latent image according to the ratio of electric potential depths of the plurality of electrostatic latent images formed by different electric potential. Therefore, the electric potential depths of the electrostatic latent image can be quantified, the ratio of the electric potential depths of the electrostatic latent image can be calculated, and the ability of forming an electrostatic latent image can be more precisely evaluated.

According to the electrostatic latent image evaluation method according to one embodiment of the present invention, the method of quantitatively evaluating the performance of the formed electrostatic latent image can be provided.

According to the electrophotographic photoreceptor according to one embodiment of the present invention, the electrostatic latent image is evaluated by the evaluation device according to one embodiment of the present invention, and the electrophotographic photoreceptor which satisfies a predetermined condition is selected according to the evaluation result. Therefore, the quality of each process for forming an electrophotography is improved, and a high quality electrophotography can be obtained. The evaluation result of the ability of forming an electrostatic latent image can be fed back to the design of the electrophotographic photoreceptor, so that the electrophotographic photoreceptor having a high image quality, high durability, high stability and good energy saving can be provided.

According to the image forming device according to one embodiment of the present invention, which forms an image by conducting the electrophotographic process on the photoreceptor, the ability of forming an electrostatic latent image is evaluated by the electrostatic latent image evaluation device according to one embodiment of the present invention, and the electrophotographic photoreceptor which satisfies a predetermined condition is selected according to the evaluation result. Therefore, the quality of each process for forming an electrophotography is improved, and a high quality electrophotography can be obtained. The evaluation result of the ability of forming an electrostatic latent image can be fed back to the design of the electrophotographic photoreceptor, so that the electrophotographic photoreceptor having a high image quality, high durability, high stability and good energy saving can be provided. In addition, the electrostatic latent image is evaluated by developing and visualizing, so that the electrophotographic photoreceptor having a high image quality, high durability, high stability and good energy saving can be provided. The present invention is especially applicable for the image forming device in which the multi-beam optical scanner is disposed such as a VCSEL.

Although the present invention has been described in terms of exemplary embodiments, it is not limited thereto. It should be appreciated that variations may be made in the embodiments described by persons skilled in the art without departing from the scope of the present invention as defined by the following claims.

What is claimed is:

1. An electrostatic latent image evaluation device, comprising:
   an optical scanner configured to irradiate laser light of a wavelength of 400 nm-800 nm on a photoreceptor sample, and form an electrostatic latent image;
   an electron gun configured to irradiate a charged particle beam to the photoreceptor sample having the electrostatic latent image, and surface electric charge distribution or surface electric potential distribution;
   a detector configured to detect an electron emitted from the photoreceptor sample by the irradiation of the charged particle beam; and
   an electrostatic latent image evaluation section configured to calculate areas of a plurality of electrostatic latent images according to signals detected by the detector, and to evaluate the photoreceptor sample according to a change in the calculated areas, and
   wherein the electrostatic latent image evaluation section is configured to calculate, as an evaluation value of the photoreceptor sample, a ratio of the areas of the plurality of electrostatic latent images, where the plurality of electrostatic latent images are formed by the laser light, with the exposure energy density of the laser light being changed from a standard value.

2. The electrostatic latent image evaluation device according to claim 1, wherein the electrostatic latent image evaluation section is configured to calculate a circle-equivalent diameter according to the area of each electrostatic latent image.

3. The electrostatic latent image evaluation device according to claim 1, further comprising a voltage applying section configured to change an electric potential of a surface of the photoreceptor sample, wherein the detector is configured to detect a charged particle in which a speed vector turns around before entering in the photoreceptor sample by the electric potential, and the electrostatic latent image evaluation section is configured to evaluate the photoreceptor sample according to a ratio of electric potential depths of a plurality of electrostatic latent images formed by different electric potentials.

4. An electrostatic latent image evaluation device, comprising: an optical scanner configured to irradiate laser light of a wavelength of 400 nm-800 nm on a photoreceptor sample, and form an electrostatic latent image; an electron gun configured to irradiate a charged particle beam to the photoreceptor sample having the electrostatic latent image, and surface electric charge distribution or surface electric potential distribution; a detector configured to detect an electron emitted from the photoreceptor sample by the irradiation of the charged particle beam; and an electrostatic latent image evaluation section configured to calculate sizes of a plurality of electrostatic latent images formed by the laser light each having a different exposure energy density according to a detection signal detected by the detector, and evaluate the electrostatic latent image according to a change in the calculated sizes;

wherein the electrostatic latent image evaluation section is configured to calculate an area of the electrostatic latent image;

wherein the electrostatic latent image evaluation section is configured to calculate a circle-equivalent diameter of the electrostatic latent image according to the area of the electrostatic latent image; and wherein the electrostatic latent image evaluation section is configured to calculate a spatial frequency from the circle-equivalent diameter, and calculate as an evaluation value of the electrostatic latent image, every spatial frequency, a ratio of the area of the electrostatic latent image formed by the laser light having a standard exposure energy density and the area of the electrostatic latent image formed by the laser light in which the exposure energy density is changed from a standard value.

5. The electrostatic latent image evaluation device according to claim 4, wherein if the standard exposure energy density is P1, the energy densities which are changed when calculating the ratio of the areas of the electrostatic latent images are P2, P3, and wherein P2, P3 satisfy the following conditions: $P2=(1-\alpha)\times P1$, $P3=(1+\alpha)\times P1$, and $0.03<=\alpha<=0.3$.

6. The electrostatic latent image evaluation device according to claim 4, wherein the exposure energy density is varied by changing the power of the laser of a light source.

7. An electrophotographic photoreceptor in which an electrostatic latent image is evaluated by using the electrostatic latent image evaluation device according to claim 4, wherein an acceleration voltage of the charged electron beam emitted from the electron gun is set to an acceleration voltage higher than a secondary electron, and in the case of forming an electrostatic latent image pattern by using an irradiator, which sets the electrophotographic photoreceptor to a predetermined charged potential, and the optical scanner, which deflects a luminous flux from a light source by a light deflector at a constant angular speed and scans the surface of the electrophotographic photoreceptor by condensing the deflected luminous flux on a surface to be scanned by a scanning and focusing system as a light spot, under the same condition as the charged potential of the photoreceptor, the beam spot diameter and the exposure energy density of the optical scanner in the electrophotographic device in a vacuum, in conditions that the wavelength of the laser light is 780 nm or below and an average beam spot diameter is 65 µm or above, the circle-equivalent diameter of the electrostatic latent image formed by the laser light having the standard exposure energy density is the average beam spot diameter or more, and a ratio of the areas of the electrostatic latent images formed by the laser light having the exposure energy density of +10% relative to the standard exposure energy density and the laser light having the exposure energy density −10% relative to the standard exposure energy density is 60% or above.

8. An image forming device, which forms an image by conducting an electrophotographic process on a photoreceptor, wherein the photoreceptor is the electrophotographic photoreceptor according to claim 7.

9. An electrostatic latent image evaluation method, comprising:

an optical scanning step of irradiating laser light of a wavelength of 400 nm-800 nm on a photoreceptor sample, and forming an electrostatic latent image;

an irradiation step of irradiating a charged particle beam to the photoreceptor sample having the electrostatic latent image, and surface electric charge distribution or surface electric potential distribution;

a detection step of detecting an electron emitted from the photoreceptor sample by the irradiation of the charged particle beam; and an evaluation step of calculating areas of a plurality of electrostatic latent images according to signals detected by the detector, and evaluating the photoreceptor sample according to a change in the calculated areas, and wherein the evaluation step includes calculating, as an evaluation value of the photoreceptor sample, a ratio of the areas of the plurality of electrostatic latent images, where the plurality of electrostatic latent images are formed by the laser light, with the exposure energy density of the laser light being changed from a standard value.

* * * * *